(12) United States Patent
Fortier et al.

(10) Patent No.: US 12,388,451 B2
(45) Date of Patent: Aug. 12, 2025

(54) ANALOG TRACKING CIRCUIT TO IMPROVE DYNAMIC AND STATIC IMAGE REJECTION OF A FREQUENCY CONVERTER

(71) Applicant: Analog Devices International Unlimited Company, Limerick (IE)

(72) Inventors: Justin L. Fortier, Ontario (CA); Christopher W. Angell, Cary, NC (US); David J. McLaurin, Raleigh, NC (US); Oscar S. Burbano, Greensboro, NC (US); Ionel Gheorghe, Ottawa (CA); Mostafa Haroun, Nepean (CA); Xing Zhou, Ottawa (CA)

(73) Assignee: Analog Devices International Unlimited Company, Limerick (IE)

( * ) Notice: Subject to any disclaimer, the term of this patent is extended or adjusted under 35 U.S.C. 154(b) by 121 days.

(21) Appl. No.: 17/732,099

(22) Filed: Apr. 28, 2022

(65) Prior Publication Data

US 2023/0353160 A1 Nov. 2, 2023

(51) Int. Cl.
*H03K 21/40* (2006.01)
*H03K 23/40* (2006.01)
(Continued)

(52) U.S. Cl.
CPC .............. *H03L 7/189* (2013.01); *H03K 21/40* (2013.01); *H03K 23/40* (2013.01); *H03L 7/193* (2013.01); *H04B 1/0007* (2013.01); *H04B 1/0096* (2013.01)

(58) Field of Classification Search
CPC ......... H03L 7/187; H03L 7/189; H03L 7/193; H03K 5/1565; H03K 23/40; H03K 21/40; H04B 1/0096; H04B 1/0007
See application file for complete search history.

(56) References Cited

U.S. PATENT DOCUMENTS 9,300,444 B2   3/2016  Hormis et al.
9,306,782 B2   4/2016  An et al.
(Continued)

FOREIGN PATENT DOCUMENTS

CN    116979900 A      10/2023
DE    102023108410 A1  11/2023

OTHER PUBLICATIONS

Mekikyan et al., *Duty-Cycle Correction Circuit for High Speed Interfaces*, 978-1-1281-2065-2/19 © 2019 IEEE, 4 pages.

*Primary Examiner* — Patrick C Chen
(74) *Attorney, Agent, or Firm* — Schwegman Lundberg & Woessner, P.A.

(57) ABSTRACT

Systems, devices, and methods related to frequency converter arrangements are provided. For example, a frequency converter arrangement converts a first signal centered at a first frequency to a second signal centered at a second frequency different from the first frequency. The frequency converter arrangement includes local oscillator (LO) circuitry and in-phase, quadrature-phase (IQ) mixer circuitry coupled to the LO circuitry. The LO circuitry includes duty cycle correction circuitry to adjust a duty cycle of a pair of input clock signals. The duty cycle correction circuitry includes coarse tuning circuitry responsive to a digital calibration code, and analog tuning loop circuitry. The LO circuitry further includes quadrature divider circuitry coupled to an output of the duty cycle correction circuitry, where the quadrature divider circuitry generates an in-phase LO signal and a quadrature-phase LO signal from a pair of output clock signals at outputs of the duty cycle correction circuitry.

9 Claims, 11 Drawing Sheets

(51) Int. Cl.
*H03L 7/189* (2006.01)
*H03L 7/193* (2006.01)
*H04B 1/00* (2006.01)

(56) References Cited

U.S. PATENT DOCUMENTS

| | | |
|---|---|---|
| 9,356,732 B2 | 5/2016 | Schubert et al. |
| 10,050,744 B2 | 8/2018 | An et al. |
| 10,963,002 B1* | 3/2021 | Hafizi ....................... G06F 1/10 |
| 2009/0168939 A1* | 7/2009 | Constantinidis .... H04W 52/028 |
| | | 375/316 |
| 2020/0007142 A1* | 1/2020 | Murphy ............... H03K 5/2427 |
| 2021/0175896 A1* | 6/2021 | Melanson ............. H03M 3/502 |

* cited by examiner

ANALOG TRACKING CIRCUIT TO IMPROVE DYNAMIC AND STATIC IMAGE REJECTION OF A FREQUENCY CONVERTER

TECHNICAL FIELD OF THE DISCLOSURE

The present disclosure generally relates to electronics, and more particularly to frequency converters in signal receivers and transmitters.

BACKGROUND

Radio frequency (RF) systems are systems that transmit and receive signals in the form of electromagnetic waves in a frequency range between about 3 kilohertz (kHz) to about 300 gigahertz (GHz). Radio systems are commonly used for wireless communications, with cellular/wireless mobile technology being a prominent example.

Zero intermediate frequency (ZIF) or direct conversion architectures are common in wireless transmitters and/or wireless receivers where a single complex mixer stage is used to translate between an RF, which is centered around a local oscillator (LO) frequency, and a baseband, which is centered around a direct current (DC). Using a single complex mixer stage can reduce the number of frequency-dependent components in the analog frontend of a system, and thus can be attractive. However, ZIF architectures can bring challenges as well. For instance, a complex mixer may generate in-phase (I) and quadrature-phase (Q) signals. In the case of a transmitter, the complex mixer may upconvert I and Q signals from a baseband to an RF. On the other hand, in the case of a receiver, the complex mixer may downconvert an RF signal to I and Q signals at a baseband.

Any mismatch in the phase and/or amplitude of the I and Q signals can degrade the summing and cancellation that occurs when the upconverted I and Q signals are combined at a transmitter or when the downconverted I and Q signals are combined at a receiver. Imperfect cancellation results in an inverted copy of the desired signal appearing on the opposite side of the local oscillator (LO) frequency from the desired signal when transmitting. This copy is referred to as an image and may have a reduced amplitude compared to the desired signal. Similarly, an inverted copy of the desired signal may appear on the opposite side of DC from the desired signal when receiving. In some other architectures (e.g., super heterodyne), this image can be filtered at an intermediate frequency stage. The primary advantage of the ZIF architecture is the removal of those filters and the intermediate mixer stage, but this necessitates very good I and Q balance to reduce the image amplitude to an acceptable level.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1A:
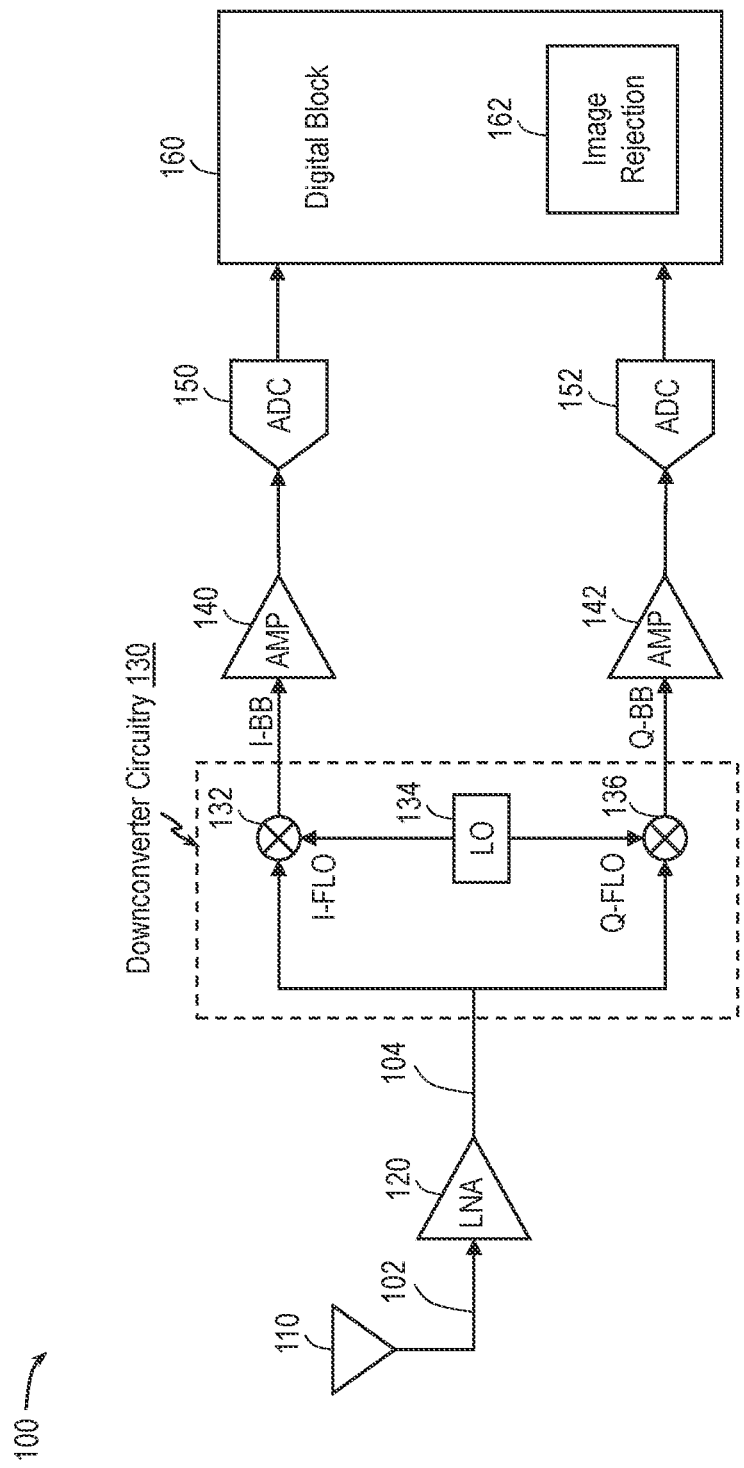
FIG. 1A is a schematic diagram illustrating an exemplary signal receiver chain in which analog duty cycle tracking loop with coarse tuning may be implemented for downconversion, according to some embodiments of the disclosure.

The systems, methods and devices of this disclosure each have several innovative embodiments, no single one of which is solely responsible for all of the desirable attributes disclosed herein. Details of one or more implementations of the subject matter described in this specification are set forth in the description below and the accompanying drawings.

As described above, a receiver may utilize a zero intermediate frequency (ZIF) or direct downconversion architecture to convert an incoming radio frequency (RF) signal to baseband in-phase (I) and quadrature-phase (Q) signals. The ZIF or direct downconversion receiver may rely on complex mixing to obtain the baseband I and Q signals and may suppress the image signals from the mixing. To that end, a downconverter can utilize a quadrature local oscillator (LO) (I and Q LOs) to mix the RF signal (carrying data information) down to the baseband. The quadrature LO may be set to a frequency at about a center frequency of the incoming RF signal. Subsequently, the baseband I and Q signals can be digitized, phase-shifted, and combined digitally to obtain the desired signal. In a similar way, a complex upconverter at a transmitter may utilize a quadrature LO to mix baseband I and Q signals up to an RF frequency band.

Complex mixing is typically implemented using analog circuitries. However, analog mixing can be challenging due to lack of precise quadrature generation. One approach to providing a wideband quadrature LO is to use a voltage-controlled oscillator (VCO) or a VCO with a phase-locked loop (PLL) to provide an LO signal with a frequency that is twice the frequency of a desired LO signal, followed by quadrature divide-by-two circuitry. For instance, the desired LO signal frequency may be represented by FLO, the VCO and/or PLL may provide a differential LO signal with a frequency of 2XFLO, and the quadrature divide-by-two circuitry may generate an I LO signal and a Q LO signal at the desired LO frequency based on the positive edges and negative edges of the 2XFLO signal. The positive edges and the negative edges of the 2XFLO signal may be referred to as a 2XFLO+ signal and a 2xFLO− signal, respectively. Under an ideal operating condition, the 2XFLO+ signal and the 2xFLO− signal may be 180 degrees out-of-phase from each other and may each have a 50% duty cycle.

However, there can be signal integrity issues in the 2XFLO+ signal and the 2xFLO-signal, for example, when the receiver including the LO circuitry is implemented as part of a transceiver integrated circuit (IC). In the transceiver IC, the 2XFLO signal (including 2XFLO+ and 2XFLO−) may be distributed to many portions of the transceiver IC before reaching the quadrature divide-by-two circuitry. The distribution of the 2XFLO signal (at the RF frequency of an incoming signal) can lead to the signal integrity issues, for example, including errors in the phases of the 2XFLO+ and 2XFLO− signals. In general, there can be two types of errors, static differential errors and dynamic differential errors. The static differential errors may be caused by a systematic difference between the distribution paths (or signal paths) of the 2XFLO+ and 2XFLO− signals. Thus, the static differential errors may appear in the form of a constant phase shift from 180 degrees between the 2XFLO+ and 2XFLO− signals and/or a constant differential duty cycle between the 2XFLO+ and 2XFLO− signals. On the other hand, the dynamic differential errors are caused by uncorrelated flicker induced phase noises in the 2XFLO+ and 2XFLO-signals. As IC processes shrink and LO frequency increases for modern transceivers, flicker induced phase noise is prone to occur.

At the quadrature divide-by-two circuitry, errors in the phase of the incoming differential 2XFLO signal (the 2XFLO+ and 2XFLO− signals) can lead to quadrature error (e.g., non-90 degrees phase offset) in the output-going I and Q LO signals. More specifically, the uncorrelated phase noise on the positive and negative edges of the 2XFLO signal can cause the instantaneous signals (e.g., the 2XFLO+ signal and 2XFLO− signal) to vary from the 180 degrees phase offset. The non-180 degrees phase offset in the instantaneous 2XFLO+ signal and 2XFLO-signals can lead to time-varying quadrature errors in the I and Q LO signals. That is, the presence of phase noise on the positive and negative edges of the 2XFLO signal can cause quadrature corruption that is dynamic in time. At a receiver, quadrature error may lead to imperfect image rejection. Further, when operating in a cellar radio environment, interference can occur at the image frequency, and in some instances, can be larger (e.g., >80 decibels (dB)) than the desired signal. The interfering signal may be mixed with the image to fold back into the desire signal frequency band, corrupting the desired signal. At a transmitter, the quadrature error may lead to a transmitted signal not only at the desired frequency but also an image of the desired signal appearing on the opposite side of the LO frequency from the desired signal, causing interference to other transmitters and/or receivers. Accordingly, it may be desirable to reduce quadrature errors in the I and Q LO signals at signal receivers and/or transmitters.

There are various approaches for correcting and/or compensating quadrature errors (or in-phase quadrature-phase (10) mismatch) at a quadrature receiver. In one approach, pre-divide-by-two circuitry can be used prior to the quadrature divide-by-two circuitry to avoid the uncorrelated flicker noise, but this may necessitate an LO that has a frequency four times the desired signal frequency (the frequency of the incoming RF signal). Operating circuitries at a higher frequency can lead to higher power consumption, and thus may not be desirable. Moreover, when the desired LO frequency is high (e.g., at 6 GHz), VCOs at four times that frequency (e.g., at 24 GHz) may not be available.

In other approaches, quadrature errors in the baseband I and Q signals can be measured and corrected in a digital domain (e.g., using digital algorithms) or measured in a digital domain (e.g., using digital algorithms) and corrected in an analog domain (e.g., using analog circuitry based on digital feedbacks). These techniques can generally correct quadrature errors due to the static differential errors. However, they may not be suitable for correcting the dynamic differential errors as the digital computations for measurements and/or corrections would have to operate at a sufficiently fast rate to track the time varying uncorrelated noise which may be in the MHz range, for example. As such, performing tracking in a digital domain can be power hungry, leading to high power consumption at the receiver. Accordingly, improvements to receiver image rejection without the need for power hungry, fast, and complex digital tracking loops may be desirable.

The present disclosure describes mechanisms for reducing quadrature errors and thereby improving image rejection at quadrature receivers and improving transmission performance at quadrature transmitters. The disclosed embodiments utilize an analog duty cycle correction loop (e.g., analog circuitries) before the quadrature divide-by-two circuitry. The analog duty cycle correction loop operates on the two-times LO frequency signal (e.g., 2XFLO signal) to ensure that the output duty cycle of the 2XFLO signal is 50% before being input to the quadrature divide-by-two circuitry. The analog tuning loop can track and suppress time-varying uncorrelated phase noise (e.g., to many tens of megahertz MHz depending on the loop bandwidth) on the positive edges and the negative edges of the 2XFLO signal. A duty cycle may refer to the ratio or percentage of an active period or on-duration in a cycle time duration. The positive edges (e.g., the 2xFLO+ signal) and negative edges (e.g., the 2xFLO− signal) may each have a 50% duty cycle and may be 180 degrees out-of-phase from each other when the differential duty cycle of the 2XFLO+ and 2xFLO− signals is 50% (which also means a zero DC offset).

In one aspect of the present disclosure, an example frequency converter arrangement for converting a first signal centered at a first frequency to a second signal centered at a second frequency is provided. The frequency converter arrangement may include LO circuitry to generate I and Q LO signals, and IQ mixer circuitry coupled to the LO circuitry. In an aspect, the frequency converter arrangement may be part of a signal receiver chain, and the IQ mixer circuitry may mix the first signal (e.g., a received RF signal) with the I LO signal and the Q LO signal to generate an I component and a Q component of the second signal (e.g., at baseband). In an aspect, the frequency converter arrangement may be part of a signal transmitter chain, and the IQ mixer circuitry may mix an I component of the first signal (e.g., at baseband) with the I LO signal and a Q component of the first signal with the Q LO signal to generate the second signal (e.g., an RF signal for transmission).

According to aspects of the present disclosure, the LO circuitry may include duty cycle circuitry to adjust a duty cycle of a pair of input clock signals (e.g., positive edges and negative edges of the 2XFLO signal) to a target duty cycle (e.g., of 50%). The duty cycle circuitry may include analog tuning loop circuitry responsive to a duty cycle change (e.g., a differential duty cycle change) in the pair of input clock signals. For instance, the analog tuning loop circuitry can track and correct dynamic differential errors (e.g., flicker-based uncorrelated phased errors) in the pair of input clock signals. The duty cycle circuitry may further include coarse tuning circuitry (e.g., digital-to-analog converter (DAC) circuitry) responsive to a digital calibration code. The coarse tuning circuitry can adjust the duty cycle of the pair of input complementary clock signals to within a tuning range that can be tracked and corrected by the analog tuning loop circuitry. The LO circuitry may further include quadrature divider circuitry (e.g., quadrature divide-by-two circuitry) coupled to an output of the duty cycle circuitry. The quadrature divider circuitry may generate the I and Q LO signals (at the desired LO frequency) from a pair of output clock signals (e.g., duty cycle adjusted signals) output by the duty cycle circuitry.

In some aspects, the duty cycle circuitry may include a forward clock path and a feedback clock path. The forward clock path may include analog tuning circuitry and the coarse tuning circuitry. The feedback clock path may be coupled to an output of the forward clock path and may include analog feedback integrator circuitry. The analog tuning circuitry and the analog feedback integrator circuitry may be part of the analog tuning loop circuitry. The analog feedback integrator circuitry may generate an analog feedback signal representing duty cycle information (e.g., differential duty cycle information) of the pair of output clock signals (e.g., output by the duty cycle correction circuitry). For instance, the analog feedback integrator circuitry may integrate the pair of output clock signals to generate the analog feedback signal In some aspects, the forward clock path may include a pair of differential clock paths, each coupled to one of the input clock signals, and the analog tuning circuitry may include a current steering element (e.g., including a pair of differential amplifiers and a tail current source) coupled to the pair of differential clock paths and may steer at least one of a first current to one clock path of the pair of differential clock paths or a second current to the other clock path of the pair of differential clock paths, where the steering is responsive to the analog feedback signal. In some aspects, the coarse tuning circuitry may include a current DAC to steer a current to one clock path of the pair of differential clock paths or the other clock path of the pair of differential clock paths, where the steering is responsive to the digital calibration code.

In some aspects, the duty cycle circuitry may further include buffer circuitry to convert the pair of input clock signals from complementary metal-oxide-semiconductor (CMOS) voltage levels to common mode logic (CML) voltage levels prior to operating by the analog tuning circuitry and the coarse tuning circuitry. The duty cycle circuitry may also include level adjustment circuitry after the analog tuning circuitry and the coarse tuning circuitry to limit (or clip) voltage levels of the pair of output clock signals based on a certain threshold and scale (or amplify) the voltage levels of the pair of output clock signals, for example, to full-swing voltage levels. The level adjustment circuitry may further convert the pair of output clock signals from the CML voltage levels back to the CMOS voltage levels.

In a further aspect of the present disclosure, the coarse tuning circuitry or DAC circuitry can be calibrated (e.g., to determine the digital calibration code) by a firmware algorithm executing on a controller in communications with the downconverter arrangement and/or the receive signal chain. The calibration may include varying an input code to the DAC circuitry across a series of DAC codes. In some instances, the input code may be varied in a descending order by stepping down the input DAC code by 1 in each step. In other instances, the input DAC code can be stepped in an ascending order instead. The calibration may further include monitoring an output of the analog feedback integrator circuitry. The output of the analog feedback integrator circuitry may be indicative of duty cycle information (e.g., differential duty cycle information) associated with a pair of clock signals (at the input of the analog feedback integrator circuitry corresponding to outputs of the forward clock path) and responsive to the varying of the input code to the coarse tuning circuitry. In this regard, the analog feedback integrator circuitry may generate an output or a feedback for each input DAC code while the input DAC code is being varied. The calibration may further include determining, based on the monitoring, an upper bound value and a lower bound value associated with a tuning range of the analog tuning loop circuitry (including the analog tuning circuitry and the analog feedback integrator circuitry) and configuring the DAC circuitry with a calibration DAC code based on the upper bound value and the lower bound value associated with the tuning range. In some instances, the calibration DAC code may be an average of the upper bound value and the lower bound value and the calibration DAC code may be used while the analog tuning circuitry is in operation. In this way, the coarse tuning or calibration may adjust the duty cycle of the pair of clock signals to be about the center of the tuning range of the analog tuning circuitry.

In some aspects, the upper bound value can be determined by identifying, based on the monitoring, a first DAC code of the series of DAC codes that causes a first output of the analog feedback integrator circuitry to transition from a first state (e.g., the inputs of the analog feedback integrator circuitry having a differential duty cycle below the 50% target duty cycle) to a second state (e.g., the inputs of the analog feedback integrator circuitry having a differential duty cycle satisfying the 50% target duty cycle) and assigning the first DAC code to the upper bound value. Subsequently, the lower bound value can be determined by identifying, based on the monitoring, a second DAC code of the series of DAC codes that causes a second output of the feedback integrator circuitry to transition from the second state to a third state (e.g., the inputs of the analog feedback integrator circuitry having a differential duty cycle exceeding the 50% target duty cycle) and assigning the second DAC code to the lower bound value. In some aspects, the duty cycle of the pair of input complementary clock signals may skew high or skew low in which the upper bound value or the lower bound value may be respectively limited to a full-scale DAC code (e.g., a maximum of 15 for a 4-bit DAC) or a zero-scale DAC code (e.g., a minimum of 0).

In some aspects, the duty cycle circuitry may include a calibration analog-to-digital converter (ADC) to convert analog feedback signals (generated by the analog feedback integrator circuitry) into digital codes that can be read and processed by the controller for determining the upper bound and lower bound of the analog loop tuning range. In this regard, the calibration method may further include calibrating a common mode voltage of the analog feedback integrator circuitry and configuring the calibration ADC (e.g., comparator threshold(s)) based on the calibrated common mode voltage.

The systems, schemes, and mechanisms described herein advantageously improve image rejection performance in quadrature or direct conversion receivers by tracking and correcting or suppressing dynamic differential noise (flicker-based uncorrelated noise) in the clock signals before the quadrature divide-by-two circuitry rather than allowing the noise to propagate to the quadrature divide-by-two circuitry and relying on error detection and/or correction in the digital domain. Similarly, the disclosed LO circuitry with duty cycle correction can improve transmission performance in quadrature transmitters. Tracking and correcting the flicker-based uncorrelated noise in the analog domain can avoid utilizing complex and/or power-hungry digital tracking algorithms when the desired LO frequency is high (e.g., about 3 GHz). Utilizing the coarse tuning circuitry to bring the duty cycle of the input clock signals to within a range of the analog tuning loop circuitry can ease the design and operations of the analog tuning loop circuitry and allow for a fast convergence time. While the present disclosure may discuss the duty cycle correction circuitry in the context of adapting or correcting dynamic differential errors (e.g., uncorrelated flicker-based phase noise) in a 2XFLO signal, the duty cycle correction circuitry may also correct static differential errors in the 2XFLO signal. Further, while the present disclosure discusses duty cycle correction for a 2XFLO clock signal, the same duty cycle correction circuitries may be suitable for correcting duty cycles of clock signals at other frequencies.

Example Signal Receiver Chain and Signal Transmitter Chain

Figure 1B:
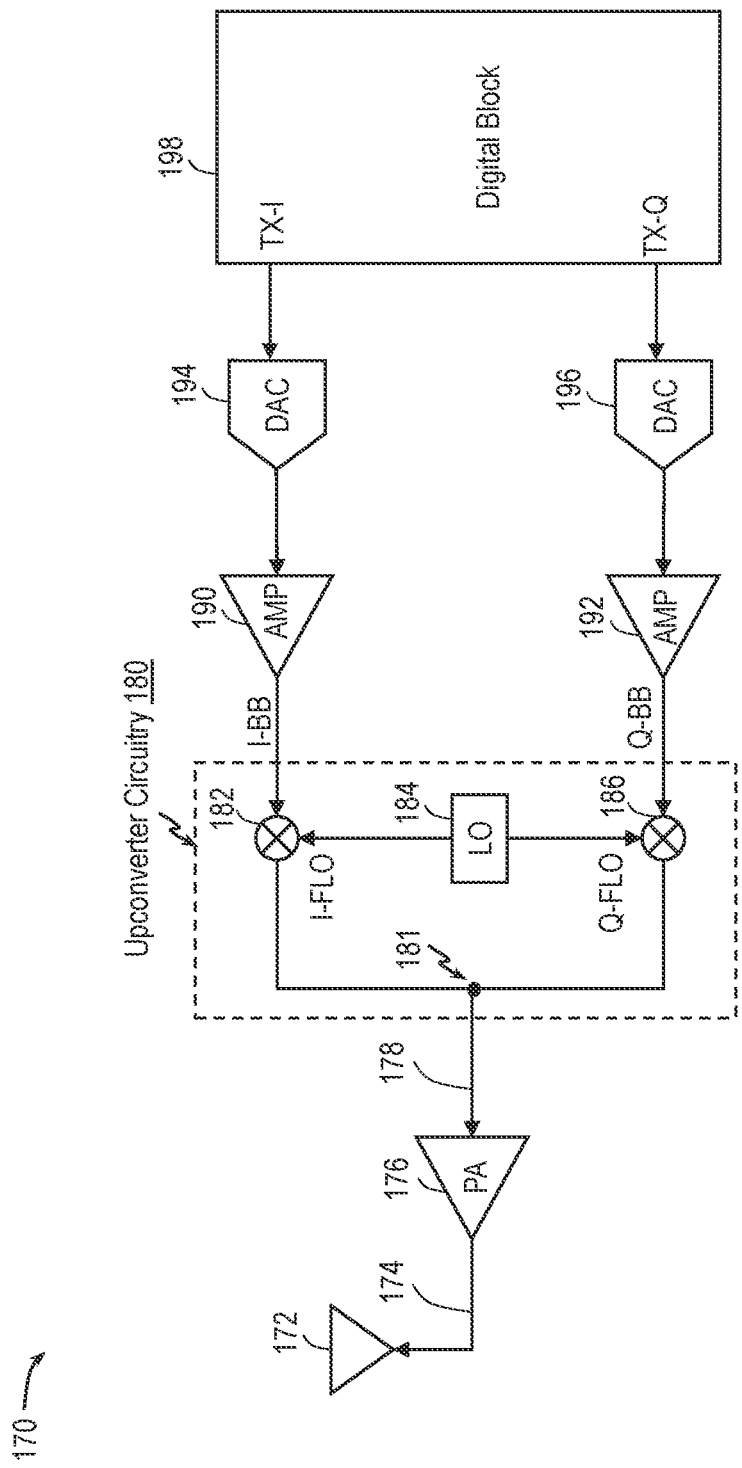
FIG. 1B is a schematic diagram illustrating an exemplary signal transmitter chain in which analog duty cycle tracking loop with coarse tuning may be implemented for upconversion, according to some embodiments of the disclosure.

A radio transceiver may utilize quadrature receiver and transmitter, for example, as shown in FIGS. 1A and 1B, respectively, for wireless communication. FIG. 1A is a schematic diagram illustrating an exemplary signal receiver chain 100 in which analog duty cycle tracking loop may be implemented for downconversion, according to some embodiments of the disclosure. In some instances, the signal receiver chain 100 may be part of a transceiver. In some instances, the signal receiver chain 100 may be part of a transceiver IC. As shown in FIG. 1A, the signal receiver chain 100 may include an antenna 110, a low-noise amplifier (LNA) 120, downconverter circuitry 130, amplifiers 140 and 142, ADCs 150 and 152, and a digital block 160.

The antenna 110 may receive an RF signal 102, which may be amplified by the LNA 120 to provide an amplified RF signal 104. The downconverter circuitry 130 may receive the amplified RF signal 104 and generate baseband I and Q signals (shown as I-BB and Q-BB), which may collectively by referred to as I/O signals. The I signal may be amplified by the amplifier 140 and then digitized by the ADC 150. The amplifier 140 and the ADC 150 may form an I signal path (I Path). The Q signal may be amplified by the amplifier 142 and then digitized by the ADC 152. The amplifier 142 and the ADC 152 may form a Q signal path (Q Path). The digitized I/O signals may be sent to the digital block 160 for further processing. IN some aspects, the digital block 160 may include an image rejection block 162 to perform image rejection digitally. For instance, the image rejection block 162 may apply a 90 degrees phase-shift or phase-rotation to the Q signal (the digital Q signal) and combine the I signal with the phase-shifted Q signal to suppress a signal image. In some aspects, the digital block 160 may further include a quadrature error estimation and correction block to correct mismatches between the I signal and the Q signal before the image rejection block 162 performs the image rejection. Further, the digital block 160 may include other processing blocks to decode and recover data information from the baseband I and Q signals after the image rejection.

In some aspects, the downconverter circuitry 130 may include LO circuitry 134 and mixers 132 and 136. The LO circuitry 134 may generate two LO signals phase offset from each other by 90 degrees. For instance, the LO signals may be sinusoidal waveform signals, where a sine waveform signal represented by I-FLO may be sent to the mixer 132 in the top path (the I signal path) and a cosine waveform signal represented by Q-FLO may be sent to the mixer 136 in the bottom path (the Q signal path). The mixer 132 may mix (or multiply) the RF signal 104 with the I-FLO signal to generate the baseband I signal. The mixer 136 may mix (or multiple) the RF signal 104 with the Q-FLO signal to generate the baseband Q signal.

FIG. 1B is a schematic diagram illustrating an exemplary a signal transmitter chain 170 in which analog duty cycle tracking loop with coarse turning may be implemented for upconversion, according to some embodiments of the disclosure. In some instances, the signal transmitter chain 170 may be part of a transceiver. In some instances, the signal transmitter chain 170 may be part of a transceiver IC. In some instances, a transceiver IC may include the signal receiver chain 100 and the signal transmitter chain 170. The signal transmitter chain 170 may be substantially similar to the signal receiver chain 100 but in a reverse direction. As shown in FIG. 1B, the signal transmitter chain 170 may include an antenna 172, a power amplifier (PA) 176, upconverter circuitry 180, amplifiers 190 and 192, DACs 194 and 196, and a digital block 198.

The digital block 198 may encode data information and generate digital baseband I/O signals shown as TX-I (the I component) and TX-Q (the Q component) from the encoded data information. The TX-I signal may be transmitted along an I signal path, and the TX-Q signal may be transmitted along a Q signal path. The TX-I signal may be converted to an analog signal by the DAC 194 and then amplified by the amplifier 190, where the amplified signal is shown as I-BB. The TX-Q signal may be converted to an analog signal by the DAC 196 and then amplified by the amplifier 192, where the amplified signal is shown as Q-BB.

The upconverter circuitry 180 may be substantially similar to the downconverter circuitry 130 in FIG. 1A. As shown in FIG. 1B, the upconverter circuitry 180 may include LO circuitry 184 and mixers 182 and 186. The LO circuitry 184 may generate two LO signals phase offset from each other by 90 degrees. For instance, the LO signals may be sinusoidal waveform signals, where a sine waveform signal represented by I-FLO may be sent to the mixer 182 in the top path (the I signal path) and a cosine waveform signal represented by Q-FLO may be sent to the mixer 186 in the bottom path (the Q signal path). The mixer 182 may mix (or multiply) the amplified signal I-BB from the I signal path with the I-FLO signal, and the mixer 186 may mix (or multiply) the amplified signal Q-BB from the Q signal path with the Q-FLO signal. The output signal from the mixer 182 and the output signal from the mixer 188 may be summed at the summing node 181 to generate an RF signal 178. The PA 176 may amplify the RF signal 178, and the antenna 172 may wirelessly transmit the amplified RF signal 174.

In some aspects, the LO circuitry 134 at the signal receiver chain 100 and/or LO circuitry 184 at the signal transmitter chain 180 may include a VCO (e.g., VCO 210 of FIG. 2) and/or PLL and quadrature divide-by-two circuitry (e.g., quadrature divide-by-two circuitry 240). The VCO and/or PLL may generate an LO signal with a frequency that is twice the frequency of the desired LO signals, and the quadrature divide-by-two circuitry may generate the signals I-FLO and Q-FLO at the desired LO frequency (e.g., represented by FLO) from the LO signal provided by the VCO and/or PLL. As an example, at the signal receiver chain 100, if the incoming RF signals 102 and 104 has a center frequency at about 3 GHz, then the desired frequency for the I-FLO and Q-FLO signals will be at about 3 GHz, and hence the VCO and/or PLL may provide an LO signal with a frequency of 6 GHz. As another example, at the signal transmitter chain 170, if the desired frequency for the RF signal is at 3 GHz, then the desired frequency for the I-FLO and Q-FLO signals will be at about 3 GHz, and hence the VCO and/or PLL may provide an LO signal with a frequency of 6 GHz. The LO signal provided by the VCO and/or PLL may be referred to as a 2XFLO signal. In an aspect, the quadrature divide-by-two circuitry may generate the I-FLO and Q-FLO signals from positive edges and negative edges of the 2XFLO signal. That is, the quadrature divide-by-two circuitry may receive a 2XFLO+ signal corresponding to positive edges of the 2XFLO signal and a 2XFLO− signal corresponding to negative edges of the 2XFLO signal and may generate the I-FLO and Q-FLO signal from the pair of 2XFLO+ and 2XFLO− signals.

As mentioned above, when the receive signal chain 100 or when the signal transmitter chain 170 is implemented as part of an IC, the 2XFLO signal may be distributed over multiple portions of the IC. Distribution of 2XFLO signal (being at an RF) can lead to signal integrity issues including errors in the phase of the 2XFLO signal. These errors are mostly due to flicker noise in the distribution paths. Furthermore, because the positive edges (the 2XFLO+ signal) and the negative edges (the 2XFLO− signal) of the 2XFLO signal can traverse through different distribution or signal paths to reach the quadrature divide-by-two circuitry, the flicker-based phase noise in the 2XFLO+ and 2XFLO− signals may be uncorrelated. As explained above, these uncorrelated flicker-based noise may vary over time and can cause the duty cycle of the 2XFLO+ and 2XFLO− signals to vary over time.

Because the generation of the I-FLO signal and Q-FLO signal at the quadrature divide-by-two circuitry are triggered respectively by the 2XFLO+ signal and the 2xFLO− signal, any error in the duty cycle (e.g., a deviation from a 50% duty cycle) of the 2XFLO+ and the 2XFLO− signals can cause the I-FLO and Q-FLO signals to be phase offset from each other by non-90 degrees (e.g., greater than or less than 90 degrees). The imperfect quadrature LOs (the I-FLO and Q-FLO signals) can degrade system performance. For instance, when imperfect LOs are used at the receive signal chain 100, it may result in a reduced image suppression at the image rejection block 162. When imperfect LOs are used at the transmitter signal chain 100, it may result in an inverted copy (image) of the desired signal appearing on the opposite side of the local oscillator (LO) frequency from the desired signal when transmitting.

According to aspects of the present disclosure, the LO circuitry 134 in the signal receiver chain 100 may include duty cycle correction circuitry (e.g., the duty cycle correction circuitry 230 of FIG. 2) to correct the duty cycle of the 2XFLO+ and 2XFLO− clock signals prior to operating by the quadrature divide-by-two circuitry. Phrased differently, the present disclosure corrects errors that can lead to degraded image rejection performance in the analog domain or RF domain rather than allowing the (entire) error to propagate downstream to the digital block 160 and performing post-compensation or post quadrature error correction in the digital domain. While the present disclosure describes LO circuitry 134 with duty cycle correction circuitry in the context of downconversion at the signal receiver chain 100, the duty cycle correction circuitry disclosed herein may also be used by the LO circuitry 184 for upconversion at the signal transmitter chain 170.

Example Complex Downconverter Arrangement

Figure 2:
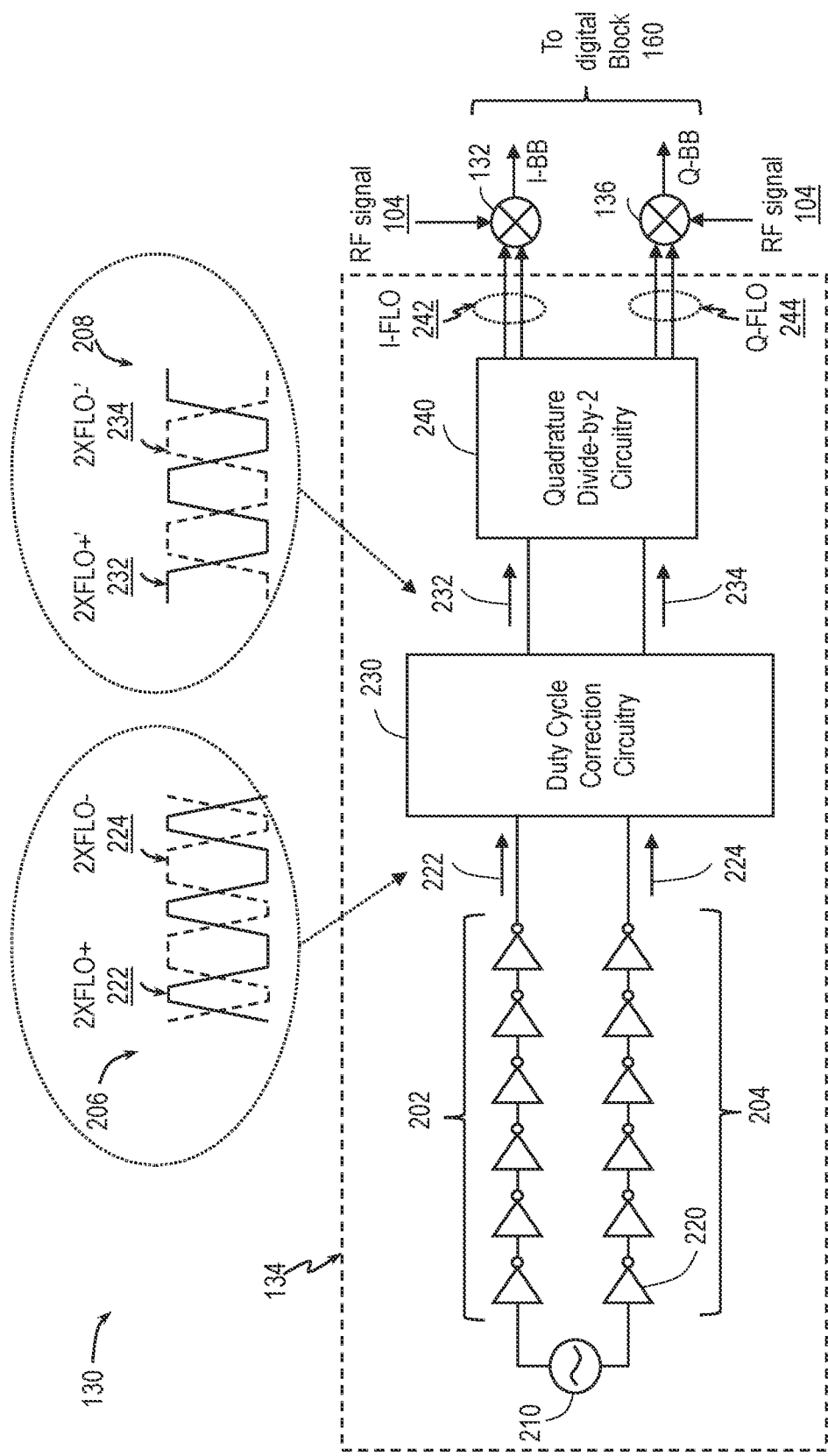
FIG. 2 is a schematic diagram illustrating exemplary downconverter circuitry, according to some embodiments of the disclosure.

FIG. 2 is a schematic diagram illustrating the downconverter circuitry 130 of FIG. 1, according to some embodiments of the disclosure. FIG. 2 provides a more detailed view of the internal components of the LO circuitry 134 of FIG. 1. As shown in FIG. 2, the LO circuitry 134 may include a VCO 210, duty cycle correction circuitry 230, and quadrature divide-by-two circuitry 240. For brevity, the operation of the portion of the downconverter circuitry 130 which duplicates elements shown in FIG. 1 will not be repeated. Further, FIG. 2 illustrates various exemplary waveform plots 206 and 208 of clock signals in the duty cycle correction circuitry 230 with the x-axes representing time in some arbitrary units and the y-axes representing voltage levels in some arbitrary units.

The VCO 210 may generate a 2XFLO signal. While not shown, in some instances, the VCO 210 may be used in combination with a PLL to provide the 2XFLO signal. As further shown in FIG. 2, the 2XFLO+ signal 222 (e.g., in the top path 202) and the 2xFLO− signal 224 (e.g., in the bottom path 204) be distributed over various portions of circuitries or IC, where the distributions may be represented by a plurality of inverters 220 (only one of which is labeled with a reference numeral in FIG. 2 in order to not clutter the drawing).

As mentioned above, because of the different signal or distribution paths 202 and 204 travelled by the 2XFLO+ signal 222 and the 2XFLO− signal 224, the 2XFLO+ signal 222 and the 2XFLO− signal 224 may experience different noise. As shown by 206 in the illustrated example of FIG. 2, the 2XFLO+ signal 222 has a duty cycle less than 50% (e.g., shown by the solid curve with the on duration being shorter than the off duration) while the 2XFLO− signal 224 has a duty cycle greater than 50% (e.g., shown by the dashed curve with the on duration being longer than the off duration) at the inputs of the duty cycle correction circuitry 230. In other examples, the 2XFLO+ signal 222 may have a duty cycle greater than 50%, and the 2XFLO− signal 224 may have a duty cycle less than 50% at the inputs of the duty cycle correction circuitry 230.

The duty cycle correction circuitry 230 may include analog circuitries to correct or adjust the duty cycle of the 2XFLO+ signal 222 and the 2XFLO− signal 224 and output duty cycle adjusted signals, for example, shown by the 2XFLO+' signal 232 and 2XFLO' signal 234, respectively. As shown by 208, the 2XFLO+' signal 232 and the 2XFLO−' signal 234, each have a duty cycle of about 50%. Operations of the duty cycle correction circuitry 230 will be discussed more fully below with reference to FIGS. 4-6.

The quadrature divide-by-two circuitry 240 may be coupled to the output of the duty cycle correction circuitry 230. The quadrature divide-by-two circuitry 240 may receive the duty cycle adjusted 2XFLO+' signal 232 and the 2XFLO−' signal 234 and generate quadrature LO signals, for example, shown by the I-FLO signal 242 and the Q-FLO signal 244. Operations of the quadrature divide-by-two circuitry 240 are discussed more fully below with reference to FIG. 3.

Example Quadrature Divide-by-Two Arrangement

Figure 3:
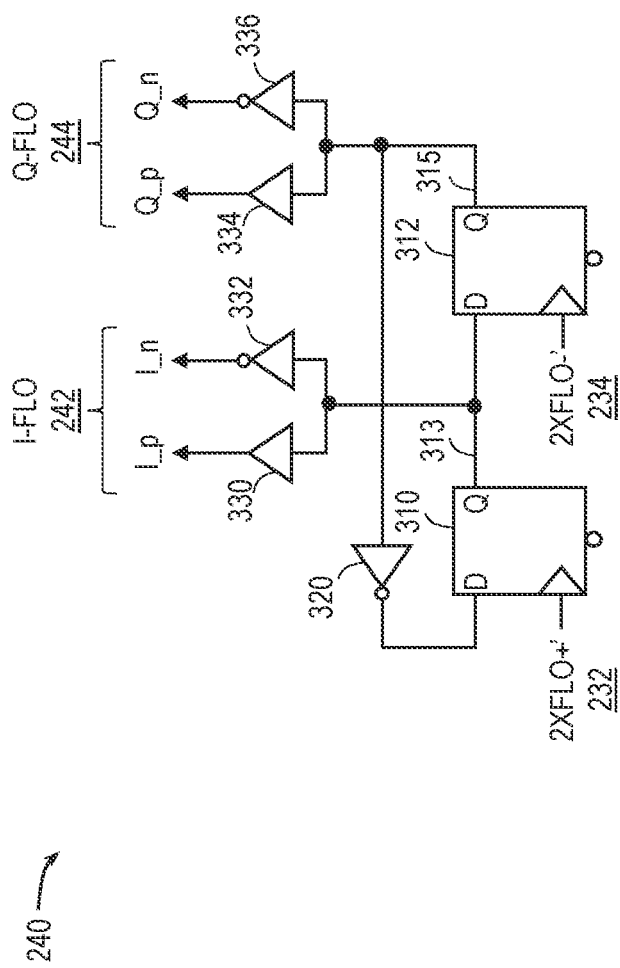
FIG. 3 is a schematic diagram illustrating an exemplary implementation of quadrature divide-by-two circuitry, according to some embodiments of the disclosure.

FIG. 3 is a schematic diagram illustrating an exemplary implementation of the quadrature divide-by-two circuitry 240. As shown in FIG. 3, the quadrature divide-by-two circuitry 240 may include latch circuitries 310 and 312 (e.g., shown as D Flip-flops), inverters 320, 322, and 336, and buffers 330 and 334. The latch circuitry 310 may be clocked or triggered by the 2XFLO+' signal 232 while the latch circuitry 312 may be clocked or triggered by the 2XFLO−' signal 234 to create the I-FLO signal 242 and the Q-FLO signal 244. The input terminal (shown by the symbol "D") of the latch circuitry 310 may be coupled to the output of the inverter 320, which is coupled to an output terminal (shown by the symbol "Q") of the latch circuitry 312. The D terminal of the latch circuitry 312 may be coupled to the Q terminal of the latch circuitry 310. The Q terminal of the latch circuitry 310 may output a clock signal 313 at the desired LO frequency. The Q terminal of the latch circuitry 310 may output a clock signal 315 at the desired LO frequency. The clock signal 313 may be buffered by the buffer 330 to provide a positive component (e.g., represented by I_p) of the I-FLO signal 242 and may be inverted by the inverter 332 to provide a negative component (or positive edges) of the I-FLO signal 242. In a similar way, the clock signal 315 may be buffered by the buffer 334 to provide a positive component (or positive edges) of the Q-FLO signal 244 and may be inverted by the inverter 336 to provide a negative component (e.g., represented by I_n) of the Q-FLO signal 244.

Figure 4:
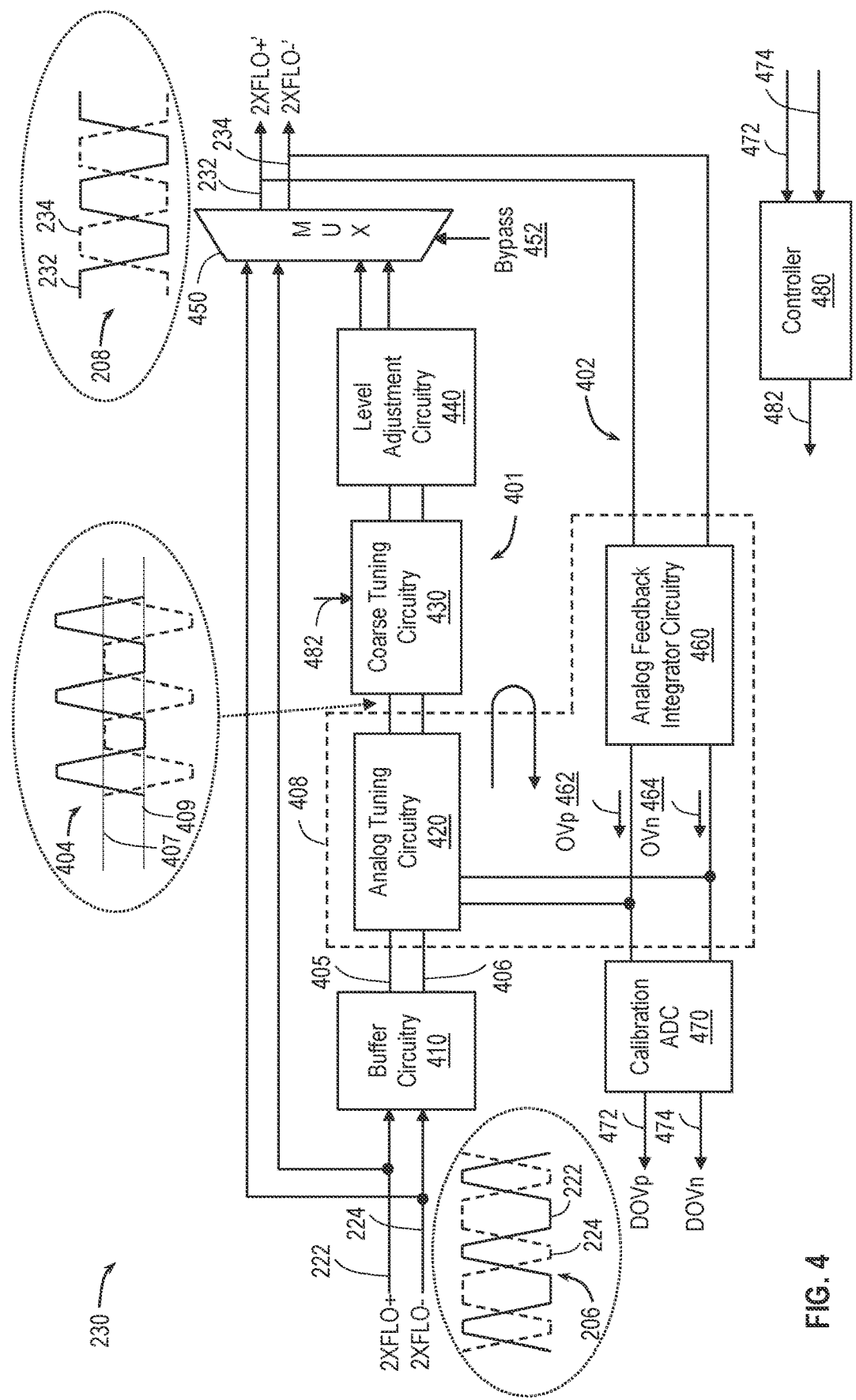
FIG. 4 is a schematic diagram illustrating exemplary duty cycle correction circuitry, according to some embodiments of the disclosure.
Figure 5:
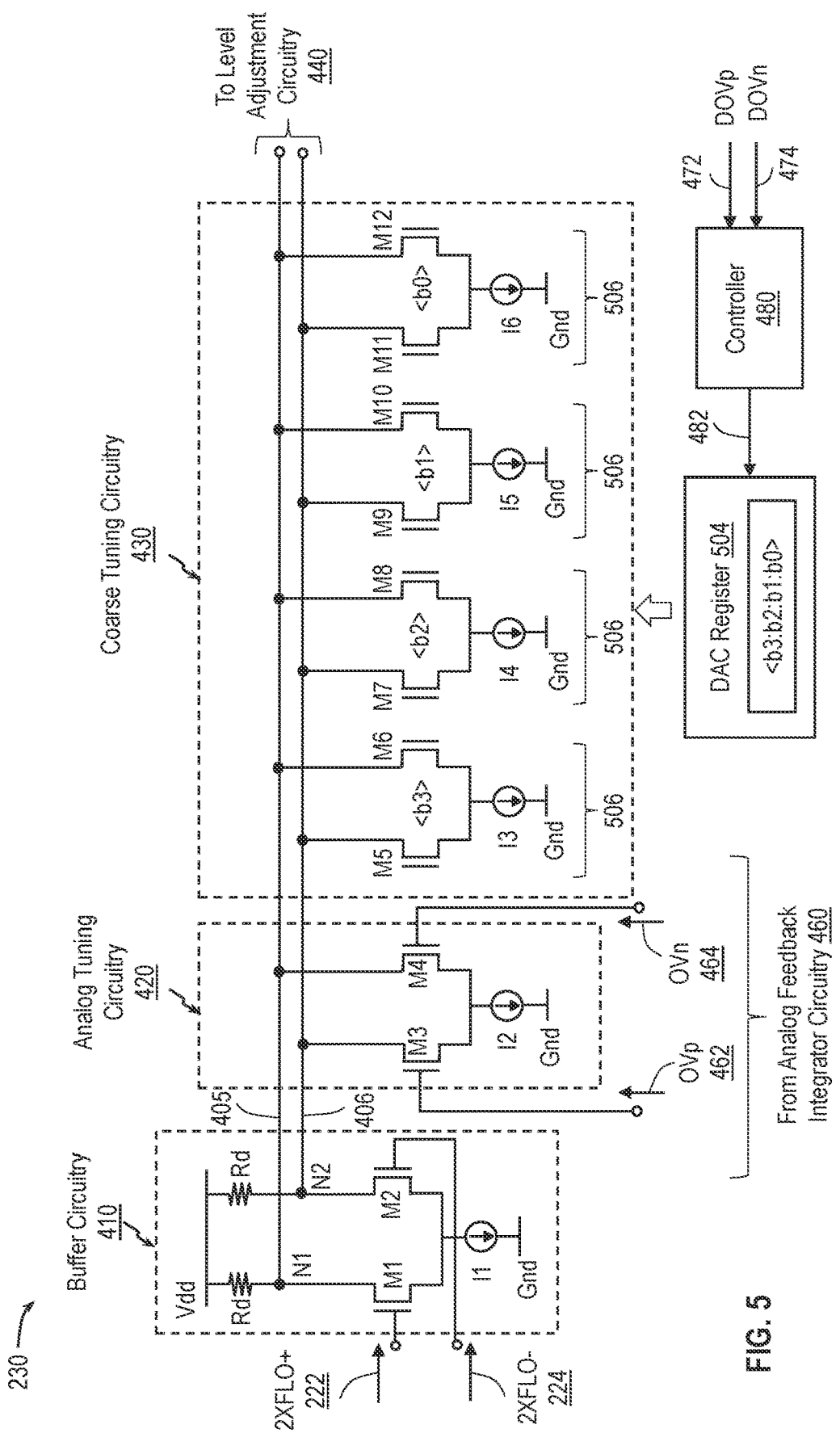
FIG. 5 is a schematic diagram illustrating a portion of the duty cycle correction circuitry of FIG. 4, according to some embodiments of the disclosure.
Figure 6:
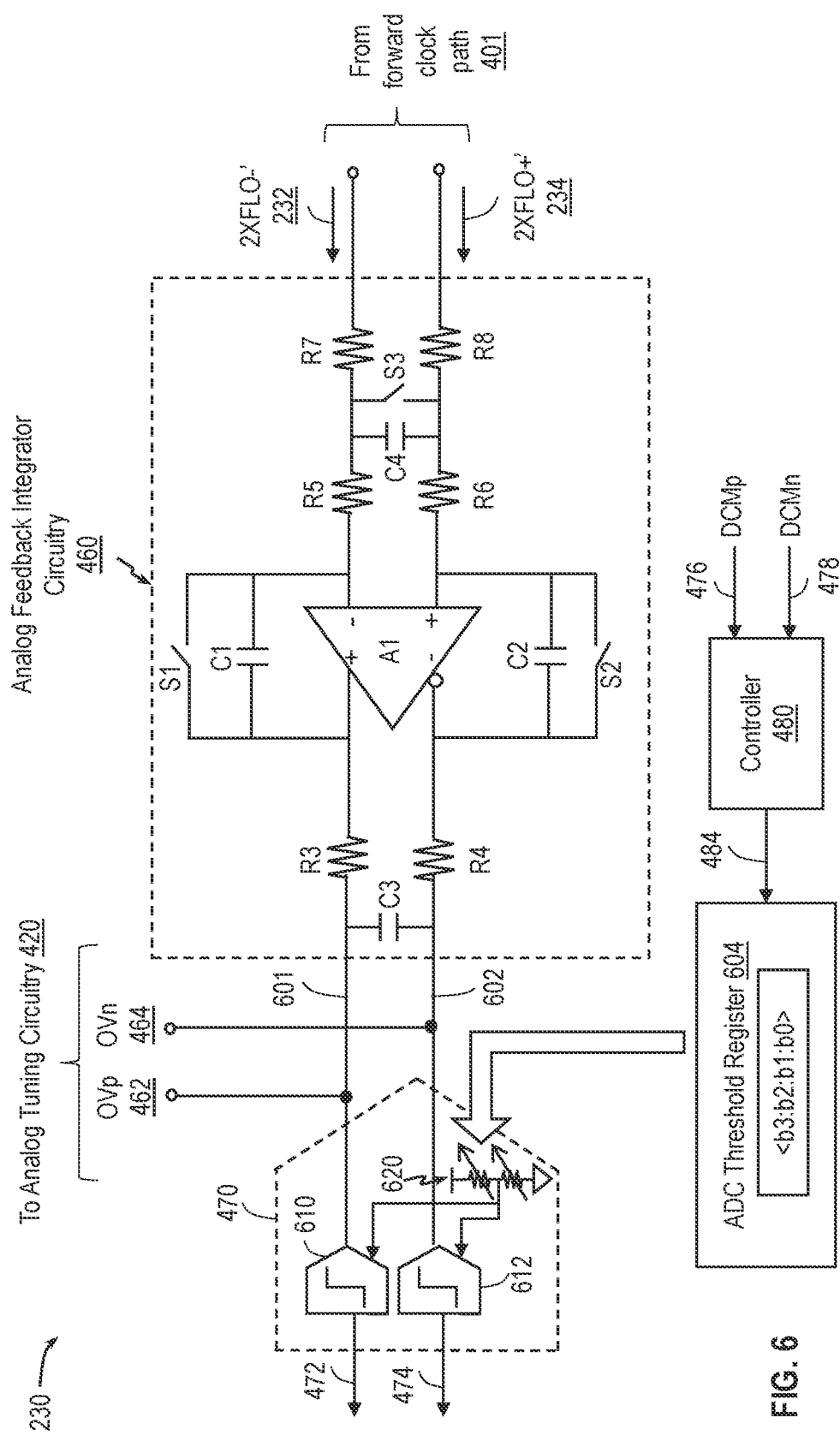
FIG. 6 is a schematic diagram illustrating another portion of duty cycle correction circuitry of FIG. 4, according to some embodiments of the disclosure.

Example Duty Cycle Correction Arrangement to Reduce Quadrature Error in Complex Mixing FIGS. 4-6 are discussed in relation to each other to illustrate operations of the duty cycle correction circuitry 230. FIG. 4 is a schematic diagram illustrating the duty cycle correction circuitry 230, according to some embodiments of the disclosure. FIG. 5 is a schematic diagram illustrating a portion of the duty cycle correction circuitry 230, according to some embodiments of the disclosure. FIG. 6 is a schematic diagram illustrating another portion of the duty cycle correction circuitry 230, according to some embodiments of the disclosure. FIG. 4 illustrates the duty cycle correction circuitry 230 at a high level. FIG. 5 illustrates a portion of a forward clock path (e.g., the forward clock path 401 of FIG. 4) of the duty cycle correction circuitry 230 in greater detail. FIG. 6 illustrates a portion of a feedback clock path (e.g., the feedback clock path 402 of FIG. 4) of the duty cycle correction circuitry 230 in greater detail. Further, FIG. 4 illustrates various exemplary waveform plots 206, 404, and 208 of clock signals in the duty cycle correction circuitry 230 with the x-axes representing time in some arbitrary units and the y-axes representing voltage levels in some arbitrary units.

As shown in FIG. 4, the duty cycle correction circuitry 230 may include a forward clock path 401 and a feedback clock path 402. The forward clock path 401 and the feedback clock path 402 are differential clock paths. The forward clock path 401 may include buffer circuitry 410, analog tuning circuitry 420, coarse tuning circuitry 430, level adjustment circuitry 440, and a multiplexer (MUX) 450. The feedback clock path 402 may be coupled to the output of the forward clock path 401 (e.g., the output of the MUX 450). The feedback clock path 402 may include analog feedback integrator circuitry 460 and a calibration ADC 470. The analog tuning circuitry 420 and the analog feedback integrator circuitry 460 may be referred to as analog tuning loop circuitry 408.

At a high level, the coarse tuning circuitry 430 may adjust the duty cycle of a pair of input signals (e.g., the 2XFLO+ signal 222 and the 2XFLO− signal 224) to the duty cycle correction circuitry 230 to within a tuning range of the analog tuning loop circuitry 408. The coarse tuning circuitry 430 may be digitally controlled, for example, based on a digital calibration code 482 determined during a calibration phase. The analog tuning loop circuitry 408 can track and suppress time-varying uncorrelated phase noise (e.g., to many tens of megahertz MHz depending on the loop bandwidth) on the 2XFLO+ and 2XFLO− signals. For instance, the analog tuning loop circuitry 408 may adapt (e.g., track and correct) the duty cycles of the input 2XFLO+ signal 222 and the 2XFLO− signal 224 responsive to relative changes in the edges of the 2XFLO+ signal 222 and the 2XFLO− signal 224 to provide adjusted signals (the 2xFLO+' signal 232 and the 2xFLO−' signal 234), for example, during an operational phase subsequent to the calibration phase. In this regard, the analog feedback integrator circuitry 460 may integrate the differential signals (e.g., the 2xFLO+' signal 232 and the 2XFLO−' signal 234) output by the forward clock path 401, feedback a correction signal (e.g., analog feedback signals OVp 462 and OVn 464) to the analog tuning circuitry 420 such so that the analog tuning circuitry 420 drive the output duty cycle to a 50% duty cycle. Further, the MUX 450 may selectively couple the 2XFLO+ signal 222 and the 2XFLO− signal 224 at the inputs of the duty cycle correction circuitry 230 directly to the outputs of the duty cycle correction circuitry 230 (bypassing duty cycle correction but outputting the 2XFLO+ signal 222 as 2XFLO−' signal 232 and the 2XFLO− signal 224 as 2XFLO+' signal 234) or couple the adjusted signals 232 and 234 based on a bypass signal 452 (a selection signal). In the illustrated example of FIG. 4, the MUX 450 couples the adjusted signals 232 and 234 to the outputs. In some aspects, the MUX 450 can be optional without providing the duty cycle correction bypass.

The buffer circuitry 410 may receive the 2XFLO+ signal 222 and the 2XFLO− signal 224, which may be generated by the VCO 210 and distributed over paths 202 and 204 as discussed above with reference to FIG. 2. The 2XFLO+ signal 222 and the 2XFLO− signal 224 may have CMOS voltage levels. The buffer circuitry 410 may convert the 2XFLO+ signal 222 and the 2XFLO− signal 224 from the CMOS voltage levels to CML voltage levels.

An example of the buffer circuitry 410 is shown in greater detail in FIG. 5. Referring to FIG. 5, the buffer circuitry 410 is based on a differential architecture. The buffer circuitry 410 may include resistors Rd, a pair of differential transistors M1 and M2, and a tail current source I1 (e.g., of about 1.5 milliampere (mA)). The resistors Rd are each coupled between a voltage supply (shown as Vdd) and a different one of the drain terminals of the transistors M1 and M2. The source terminals of the transistors M1 and M2 are connected together (at a common node) and further coupled to the tail current source I1, where the other terminal of the tail current source I1 is connected to a ground potential (shown as Gnd). The gate terminals of the transistors M1 and M2 are coupled to the inputs of the buffer circuitry 410. As shown, the gate terminal of the transistor M1 is driven by the 2xFLO+ signal 222 (the positive edges of the 2XFLO signal), and the gate terminal of the transistor M2 is driven by the 2xFLO− signal 224 (the negative edges of the 2XFLO signal).

In operation, the buffer circuitry 410 may output a pair of differential signals at a node N1 of the clock path 405 and at node N2 of the clock path 406. In this regard, the voltage levels at output nodes N1 and N2 may vary according to a difference between the voltage levels of the 2xFLO− signal 224 and the 2XFLO− signal at the respective gate terminals of M1 and M2. The output differential signals at node N1 and N2 may be at CML voltage levels having a smaller voltage swing than the input signals 222 and 224. For instance, the maximum differential output voltage swing may be dependent on the resistors Rd and the current source I1.

Referring to FIG. 4, the analog tuning loop circuitry 408 may track and correct the duty cycle of the 2XFLO+ signal 222 and the 2XFLO− signal 224 responsive to relative changes in the edges of the 2XFLO+ signal 222 and the 2XFLO− signal 224 (e.g., causing the duty cycle of the 2XFLO+ signal 222 and the 2XFLO− signal 224 to deviate from the target 50% duty cycle). More specifically, the analog tuning circuitry 420 may adjust the duty cycle of the pair of 2XFLO+ signal 222 and the 2XFLO− signal 224 such that each of the 2XFLO+ signal 222 and the 2XFLO− signal 224 may have a duty cycle satisfying the target duty cycle. The duty cycle adjustment may be based on analog feedback signals 462 and 464 (shown as OVp and OVn, respectively), which are generated by the analog feedback integrator circuitry 460 based on the output signals 232 and 234 at the outputs of the forward clock path 401. That is, the analog tuning circuitry 420 is controlled by the analog feedback integrator circuitry 460.

An example implementation of the analog tuning circuitry 420 is shown in greater detail in FIG. 5. Referring to FIG. 5, the analog tuning circuitry 420 is implemented as a current steering element including a pair of differential transistors M3 and M4 and a tail current source I2 (e.g., of about 0.2 mA). The drain terminals of the transistors M3 and M4 may be coupled to the clock paths 406 and 405, respectively. The source terminals of the transistors M3 and M4 are connected together (at a common node) and further coupled to the tail current source I2, where the other terminal of the tail current source I2 is connected to a ground potential. The gate terminals of the transistors M3 and M4 are driven by outputs of the analog feedback integrator circuitry 460. More specifically, the gate terminal of M3 is driven by the analog feedback signal OVp 462, and the gate terminal of M4 is driven by the analog feedback signal OVn 464.

In operation, the analog tuning circuitry 420 may steer a portion of a current from the current source I2 to the left branch (coupled to the clock paths 406) and another portion of the current to the right branch (coupled to the clock path 405) according to a difference or offset between the voltage levels of the analog feedback signal OVp 462 (that drives the gate terminal of M3) and the analog feedback signal OVn 464 (that drives the gate terminal of M4). The current steered to the left branch and/or the right branch can change the DC offsets of the 2XFLO+ signal 222 and the 2xFLO− signal 224. The DC offset changes in turns induces shifts to the zero-crossings between the 2XFLO+ signal 222 and the 2xFLO− signal 224. Shifting the zero-crossings with further voltage clipping (or limiting) and scaling (or amplifying) can bring the duty cycle of the 2XFLO+ signal 222 and the 2xFLO− signal 224 to a target duty cycle of 50% as will be discussed more fully below.

Referring back to FIG. 4, the input 2XFLO+ signal 222 has a duty cycle less than 50% while the input 2XFLO− signal 224 has a duty cycle greater than 50% as shown by 206. The analog tuning circuitry 420 adjusts the DC offsets of the 2XFLO+ signal 222 and the 2xFLO-signal 224 using the current steering mechanisms discussed above. As shown by 404, the 2XFLO+ signal 222 (shown by the solid line) is shifted up and the 2XFLO− signal 224 (shown by the dashed line) is shifted down by the analog tuning circuitry 420. By adjusting the DC offsets of the 2XFLO+ signal 222 and the 2xFLO− signal 224 and further applying voltage clipping and scaling, the duty cycles of the 2XFLO+ signal 222 and the 2xFLO− signal 224 can be adjusted to about 50%. In this regard, the level adjustment circuitry 440 may include a low voltage differential signaling (LVDS) hard limiter to clip the voltage level of the DC adjusted 2XFLO+ signal 222 and the 2xFLO− signal, for example, as shown by the lines 407 and 409. The level adjustment circuitry 440 may further scale (e.g., amplify) the voltage levels of the clipped 2XFLO+ signal 222 and the 2xFLO− signal 224 to convert from CML voltage levels back to CMOS voltage levels. The duty cycle adjusted signals 232 and 234 at the output of the forward clock path 401 may be as shown by 208.

An example implementation of the analog feedback integrator circuitry 460 is shown in greater detail in FIG. 6. Referring to FIG. 6, the feedback clock path 402 may include a pair of differential clock paths 601 and 602 coupled to the differential clock paths 405 and 406 of the forward clock path 401, respectively. The analog feedback integrator circuitry 460 is implemented as a fully differential switched capacitor integrator coupled to the differential clock paths 601 and 602. The analog feedback integrator circuitry 460 may include a fully differential amplifier A1, capacitors C1, C2, C3, and C4, resistors R3, R4, R5, R6, R7, and R8, and switches S1, S2, and S3. The capacitor C1 and the switch S1 may be connected in parallel between an inverting input (shown by the symbol "−") and a non-inverting output (shown by the symbol "+") of the amplifier A1. The capacitor C2 and the switch S2 may be connected in parallel between a non-inverting input and an inverting output of the amplifier A1. The inverting input of the amplifier A1 may be further coupled to the series-connected resistors R5 and R7. The non-inverting input of the amplifier A1 may be further coupled to the series-connected resistors R6 and R8. The capacitor C4 and the switch S3 may be connected in parallel across a first junction between the resistors R5 and R7 and a second junction between the resistors R6 and R8. The non-inverting output of the amplifier A1 may be further coupled to the resistor R3 and the inverting output of the amplifier A1 may be further coupled to the resistor R4. The capacitor C3 may be coupled to the resistor R3 and R4 and across the outputs of the analog feedback integrator circuitry 460. The switches S1, S2, and S3 may be configured to enable the analog feedback integrator circuitry 460 to operate in a unity gain mode (e.g., for common mode voltage calibration) or operate in a feedback integration mode (e.g., for duty cycle detection) as will be discussed more fully below.

During the operational phase, the switches S1-S3 may be opened to operate in the feedback integration mode. The amplifier A1 may receive differential signals at its inverting and non-inverting inputs. For instance, the amplifier A1 may receive the 2XFLO+' 232 signal at its inverting input via the resistors R5 and R7 and receive 2XFLO−' 234 signal at its non-inverting input via the resistors R6 and R8. The analog feedback integrator circuitry 460 may sense and integrate voltage offsets (or differences) between the 2XFLO+' signal 232 and the 2xFLO−' signal 234 at its differential inputs via the feedback capacitors C1 and C2. Based on the integration, the analog feedback integrator circuitry 460 may provide the analog feedback signals OVp 462 and OVn 464 as voltage control signals to drive the analog tuning circuitry 420 via the resistors R3 and R4, respectively. For instance, when the differential inputs have an average or DC offset greater than zero (which also means that the differential duty cycle is greater than 50%), the voltage at the node N1 (shown in FIG. 5) may have narrower pulses (with a duty cycle less than 50%), which may then cause the output voltage level of the output analog feedback signal OVp 462 to increase.

The analog feedback integrator circuitry 460 may control the analog tuning circuitry 420 in a way that drives the differential inputs (e.g., voltage offset between the 2XFLO+' signal 232 and the 2xFLO−' signal 234) at the analog feedback integrator circuitry 460 to a target of zero. The differential inputs may be zero when each of the 2XFLO+' signal 232 and the 2xFLO−' signal 234 has 50% duty cycle and are 180 degrees out-of-phase from each other. When the voltage offset at the differential inputs is zero, the analog feedback integrator circuitry 460 may stop to integrate, and thus the outputs (e.g., the analog feedback signals 462 and 464) of the analog feedback integrator circuitry 460 may become steady (stop changing). This in turns causes the analog tuning circuitry 420 to continue to steer the same ratio of current to the clock paths 405 and 406 as before, and the feedback loop is steady. If, however, there are relative changes between the edges of the input 2XFLO+ signal 222 and the 2xFLO-signal 224, the analog feedback integrator circuitry 460 may again start to integrate, providing analog feedback signals 462 and 464 to counter the changes in which the analog tuning circuitry 420 may respond and adjust the ratio of current to be steered to the clock paths 405 and 406 accordingly. The auto-tuning may continue until the differential inputs at the analog feedback integrator circuitry 460 return to a zero DC offset again. That is, the feedback loop (the analog tuning circuitry 420 and the analog feedback integrator circuitry 460) may continuously regulate the duty cycles of the input signals whenever the duty cycles drift away from 50% target.

Referring back to FIG. 5, the analog tuning circuitry 420 may adjust the DC offset of the 2xFLO+ signal 222 and the 2XFLO− signal 224 based on the analog feedback signals OVn 464 and OVp 462, respectively. For example, when the voltage level of the analog feedback signal OVn 464 increases and the voltage level of the analog feedback signal OVp 462 decreases, the analog tuning circuitry 420 may steer an increased amount of current to the clock path 405 and steer a decreased amount of current to the clock path 406. Accordingly, the DC offset of the 2xFLO+ signal 222 may be shifted up and the DC offset of the 2XFLO− signal 224 may be shifted down. In a similar way, the analog tuning circuitry 420 may shift the DC offset of the 2xFLO+ signal 222 down and the DC offset of the 2XFLO− signal 224 up when the voltage level of the analog feedback signal OVn 464 decreases and the voltage level of the analog feedback signal OVp 462 increases. This tuning process may continue until the differential inputs at the analog feedback integrator circuitry 460 return to a zero DC offset during which the analog tuning circuitry 420 may stop changing the ratio of current steered to the clock paths 405 and 406. In general, the duty cycle correction circuitry 230 shown in FIGS. 4-6 utilizes negative feedback to provide the duty cycle correction.

In some aspects, based on the arrangement and components in the analog tuning circuitry 420 and the analog feedback integrator circuitry 460, the analog tuning loop circuitry 408 may be capable of adjusting the DC offsets of the 2xFLO+ signal 222 and the 2XFLO− signal 224 to a certain range. Accordingly, it may be desirable to utilize the coarse tuning circuitry 430 to adjust the pair of 2XFLO+ signal 222 and the 2XFLO− signal 224 to within a tuning range of the analog tuning loop circuitry 408. Further, the coarse tuning can ease the design of the analog tuning loop circuitry 408.

Referring back to FIG. 4, a controller 480 may be used to determine the digital calibration code 482 for the coarse tuning circuitry 430. The controller 480 may be any suitable processor(s), microcontroller(s), etc., and may execute a calibration algorithm, for example, stored as executable instructions (e.g., firmware) in a non-transitory computer-readable storage medium. To perform the calibration, the calibration ADC 470 may be coupled to the outputs of the analog feedback integrator circuitry 460. The calibration ADC 470 may convert the analog feedback signals 462 and 464 to digital codes, represented by DOVp 472 and DOVn 474. The controller 480 may read the digital codes DOVp 472 and DOVn 474 and determine a suitable digital calibration code 482 for the coarse tuning circuitry 430 based on the digital feedback codes DOVp 472 and DOVn 474. Mechanisms for the calibration will be discussed more fully below with reference to FIGS. 7-10.

The coarse tuning circuitry 430 may be implemented as a current DAC. An example implementation of the coarse tuning circuitry 430 is shown in greater detail in FIG. 5. In the illustrated example of FIG. 5, the coarse tuning circuitry 430 is a 4-bit DAC configured by a DAC register 504 include bits <b3:b2:b1:b0>. However, in other examples, the coarse tuning circuitry 430 can include an N-bit DAC with N being any suitable integer value (e.g., 1, 2, 3, 5, 6 or more). The coarse tuning circuitry 430 may include a plurality of current steering elements 506, each including a pair of differential transistors and a tail current source to be driven by one of the DAC bits b3, b2, b1, or b0. For instance, DAC bit b3 may drive the current steering element 506 including differential transistors M5 and M6 and the current source I3. The drain terminals of the transistors M5 and M6 may be coupled to the clock paths 406 and 405, respectively a voltage signal representing b3 and inverted b3, respectively. The source terminals of the transistors M5 and M6 are connected together (at a common node) and further coupled to the tail current source I3, where the other terminal of the tail current source I3 is connected to a ground potential. The gate terminals of the transistors M5 and M6 are driven by voltage signals representing inverted b3 and b3, respectively. For instance, if b3 is 1, the signal representing b3 may have a logic high voltage level, and the signal representing inverted b3 may have a logic low voltage level, or vice versa. The other current steering elements 506 controlled by DAC bits b2, b1, and b0 may operate in the same manner as the current steering element 506 controlled by DAC bit b3; for brevity, operations of these other current steering elements 506 will not be described. In some aspects, the current sources I3, I4, I5, I6 in the steering elements 506 of the current DAC corresponding to the DAC bits <b3:b0> can be binary weighted. For example, the current sources I3, I4, I5, I6 can be 0.2 mA, 0.1 mA, 0.05 mA, and 0.025 mA, respectively.

As further shown in FIG. 5, the controller 480 may determine the digital calibration code 482 based on the digital codes DOVp 472 and DOVn 474 and write the digital calibration code 482 to the DAC register 504. The coarse tuning circuitry 430 may steer current to the clock paths 405 and/or 406 according to the bit value of b3, b2, b1, b0. Each current steering element 506 may steer current from a respective current source to the clock path 405 or 406 according to the respective bit value.

As mentioned above, the calibration ADC 470 may convert the analog feedback signals 462 and 464 into the digital codes DOVp 472 and DOVn 474, respectively. Referring to FIG. 6, a more detailed view of the calibration ADC 470 is shown. The calibration ADC 470 may include two one-bit ADCs 610 and 612. The ADC 610 may convert the analog feedback signal OVp 462 to digital code DOVp 472, and the ADC 612 may convert the analog feedback signal OVn 464 to digital code DOVn 474. In some aspects, the analog feedback integrator circuitry 460 may have a common mode voltage. The common mode voltage (or common mode offset) can cause the analog feedback signals 462 and 464 to indicate inaccurate information about the DC offsets or duty cycles of the output signals 232 and 234. Accordingly, it may be desirable for the controller 480 to calibrate the common mode voltage of the analog feedback integrator circuitry 460 prior to calibrating the coarse tuning circuitry 430.

To measure the common mode voltage of the analog feedback integrator circuitry 460, the analog feedback integrator circuitry 460 may be configured to operate in the unity gain mode. To operate in the unity gain mode, the switch S3 may be closed to short the inputs of the differential amplifier A1, and the switches S2 and S2 may also be closed to bypass the feedback capacitors C1 and C2, respectively. That is, the analog feedback integrator circuitry 460 may operate in a unity gain mode. The controller 480 may receive digital feedback codes DCMp 476 and DCMn 478 representing analog feedback signals 462 and 464, respectively, output by the analog feedback integrator circuitry 460 and converted by the calibration ADC 470 while under the common mode voltage calibration mode. The controller 480 may determine an ADC target threshold 484 based on the digital feedback codes DCMp 476 and DCMn 478 and write the ADC target threshold 484 to an ADC threshold register 604. In the illustrated example of FIG. 6, the ADC threshold register 604 is shown to be a 4-bit register including bits <b3:b2:b1:b0>. In general, the ADC threshold register 604 can include any suitable number of bits. The value in the ADC threshold register 604 or the ADC target threshold 484 controls the comparator threshold in each of the ADCs 610 and 612. As shown, the calibration ADC 470 may include a variable resistor network 620 controlled by the ADC threshold register 604, which in turns sets the comparator threshold in the respective ADC 610 or 612. Each of the ADCs 610 and 612 may determine whether to output a digital value of 1 or a digital value of 0 based on the comparator threshold.

In some aspects, the transistors M1-M12 in the duty cycle correction circuitry 230 may be p-channel metal-oxide semiconductor (PMOS) devices. In other aspects, the transistors M1-M12 may be n-channel metal-oxide semiconductor (NMOS) devices. In general, the transistors M1-12 may be any suitable types of transistors. In other aspects, the current steering elements may be implemented using alternative circuitries to provide similar current steering operations for adjusting the DC offsets (or duty cycles) of the input clock signals 222 and 224 dynamically.

While FIGS. 2-6 are discussed in the context of the signal receiver chain 100, in some aspects, the LO circuitry 184 at the signal transmitter chain 170 may include duty cycle correction circuitry and quadrature divide-by-2 circuitry similar to the duty cycle correction circuitry 230 and the quadrature divide-by-2 circuitry 240, respectively, discussed above with reference to FIGS. 2-6.

Example Method for Quadrature LO Generation

Figure 7:
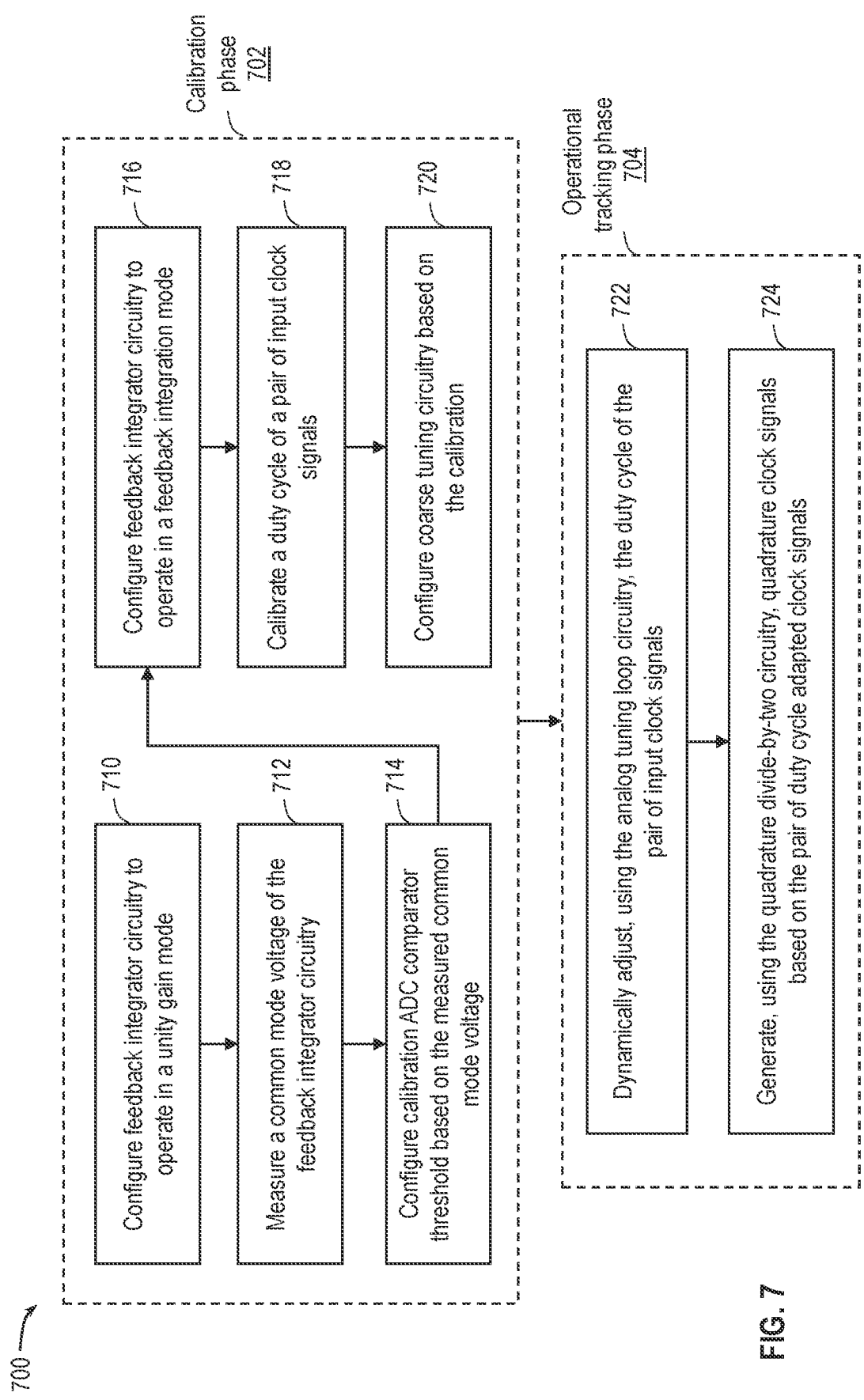
FIG. 7 is a flow diagram of an exemplary method for generating quadrature LO signals, according to some embodiments of the disclosure.

FIG. 7 is a flow diagram of an exemplary method 700 for generating quadrature LO signals, according to some embodiments of the disclosure. The method 700 is discussed in relation to FIGS. 2-6. Although the operations of the method 700 may be illustrated with reference to particular embodiments of the LO circuitry 134 and the controller 480 disclosed herein, the method 700 may be performed using any suitable hardware components and/or software components. In some examples, the method 700 may be performed by the LO circuitry 184 at the signal transmitter chain 170. Operations are illustrated once each and in a particular order in FIG. 7, but the operations may be performed in parallel, reordered, and/or repeated as desired.

The method 700 may include a calibration phase 702 and an operational tracking phase 704. The calibration phase 702 may include performing operations of 710, 712, 714, 716, 718, and 720. For instance, at 710, the analog feedback integrator circuitry (e.g., analog feedback integrator circuitry 460) may be configured to operate in a unity gain mode. Configuring the analog feedback integrator circuitry to operate in the unity gain mode may include closing the switch S3 (e.g., to short the inputs of the analog feedback integrator circuitry) and closing the switches S1 and S2 to bypass the capacitors C1 and C2 as discussed above with reference to FIG. 6.

At 712, a common mode voltage of the analog feedback integrator circuitry 460 may be measured. For instance, the outputs of the analog feedback integrator circuitry 460 may be sent to the calibration ADC 470. The calibration ADC 470 may convert the outputs of the analog feedback integrator circuitry to digital feedback codes (e.g., the DCMp 476 and DCMn 478). The digital codes may be sent to the controller 480. The controller 480 may determine a measurement for the common mode voltage of the analog feedback integrator circuitry 460 based on the digital feedback codes. Mechanisms for measuring the common mode voltage of the analog feedback integrator circuitry 460 are discussed more fully below with reference to FIGS. 8 and 10.

At 714, a comparator threshold of the calibration ADC 470 may be configured based on the common mode voltage of the analog feedback integrator circuitry 460 measured at 712.

At 716, after configuring the calibration ADC comparator threshold, the analog feedback integrator circuitry 460 may be configured to operate in a feedback integration mode. For instance, the switch S3 of the analog feedback integrator circuitry 460 may be opened to connect the inputs of the analog feedback integrator circuitry 460 to the outputs of the forward clock path 401. Further, the switches S1 and S2 may also be opened as discussed above with reference to FIG. 6.

At 718, a duty cycle of a pair of input clock signals (e.g., the 2XFLO+' signal 222 and the 2xFLO−' signal 224) may be calibrated, for example, by the controller 480 based on feedbacks provided by the analog feedback integrator circuitry 460. For instance, the controller 480 may determine a digital calibration code 482 for the coarse tuning circuitry 430 such that the duty cycle of the input clock signals may be within a range that can be tuned by the analog tuning circuitry 420. Mechanisms for determining digital calibration code 482 will be discussed more fully below with reference to FIGS. 9-10.

At 720, the coarse tuning circuitry 430 may be configured based on the calibration performed at 718. For instance, the controller 480 may write the determined digital calibration code to the DAC register 504.

After completing the calibration phase 702, the operational tracking phase 704 may begin. The operational tracking phase 704 may include performing operations of 722 and 724. For instance, at 722, the duty cycle of the pair of input clock signals is dynamically adjusted using the analog tuning circuitry 420, for example, to achieve a target duty cycle of 50% for each signal of the pair of input clock signals. In some aspects, during the operational tracking phase 704, the digitized outputs from the calibration ADC 470 may be ignored or the calibration ADC 470 can be configured to stop digitizing outputs of the analog feedback integrator circuitry 460.

At 724, quadrature clock signals (e.g., the I-FLO signal 242 and Q-FLO signal 244) may be generated based on the pair of duty cycle adapted clock signals using the quadrature divide-by-two circuitry 240.

Example Method for Duty Cycle Correction Circuitry Calibration

Figure 8:
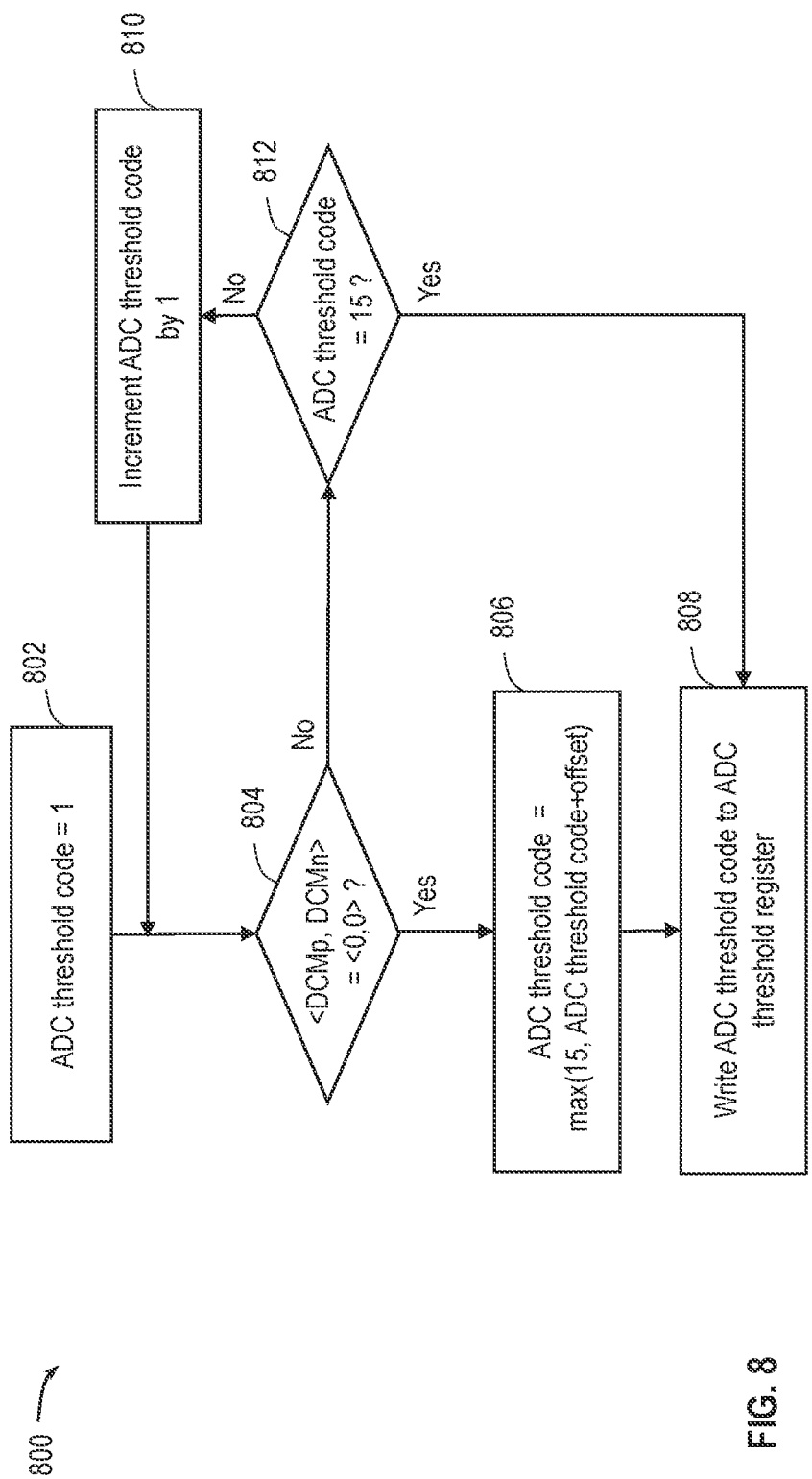
FIG. 8 is a flow diagram of an exemplary method for calibrating duty cycle correction circuitry, according to some embodiments of the disclosure.
Figure 9:
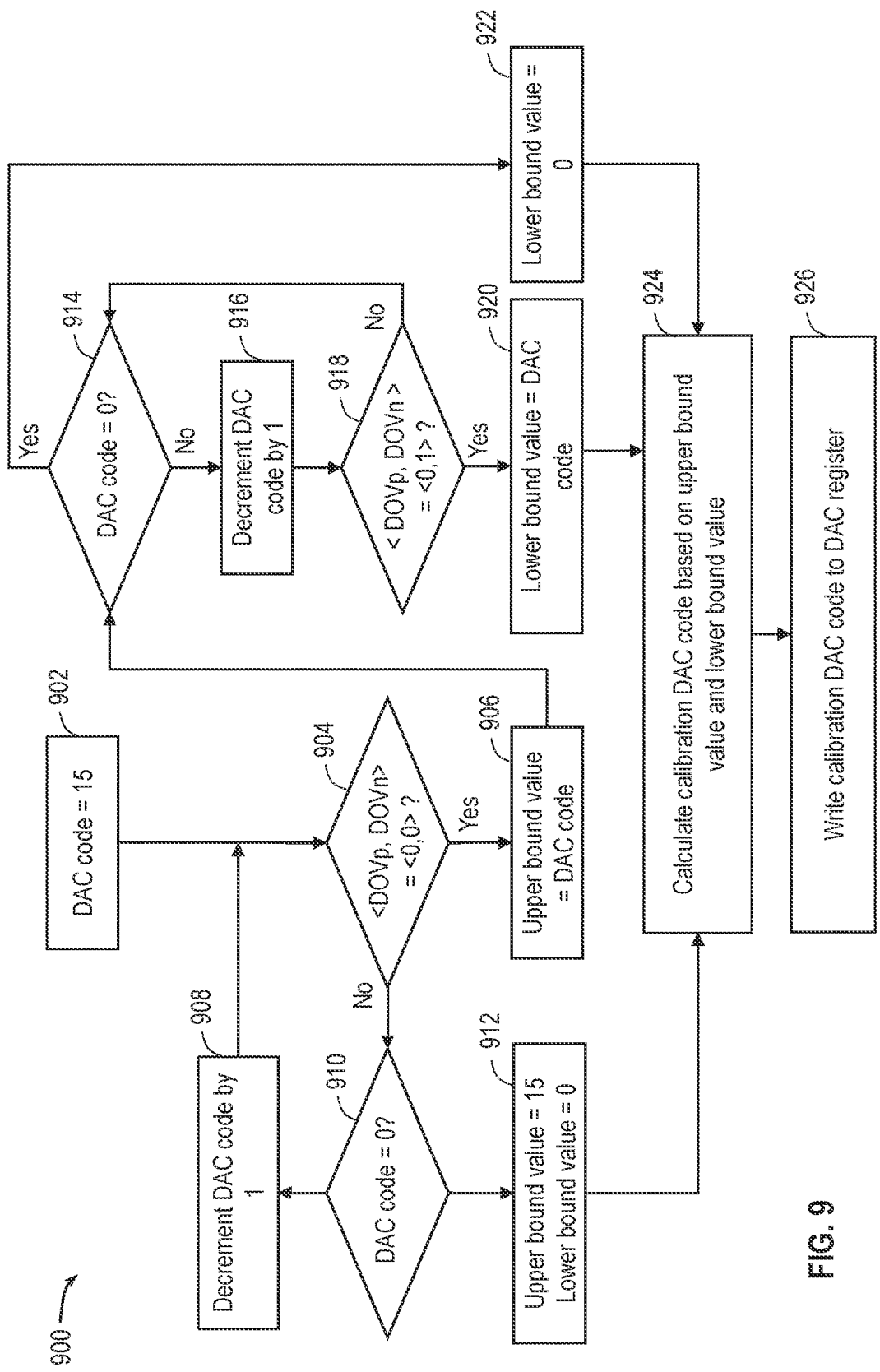
FIG. 9 is a flow diagram of an exemplary method for calibrating duty cycle correction circuitry, according to some embodiments of the disclosure.
Figure 10:
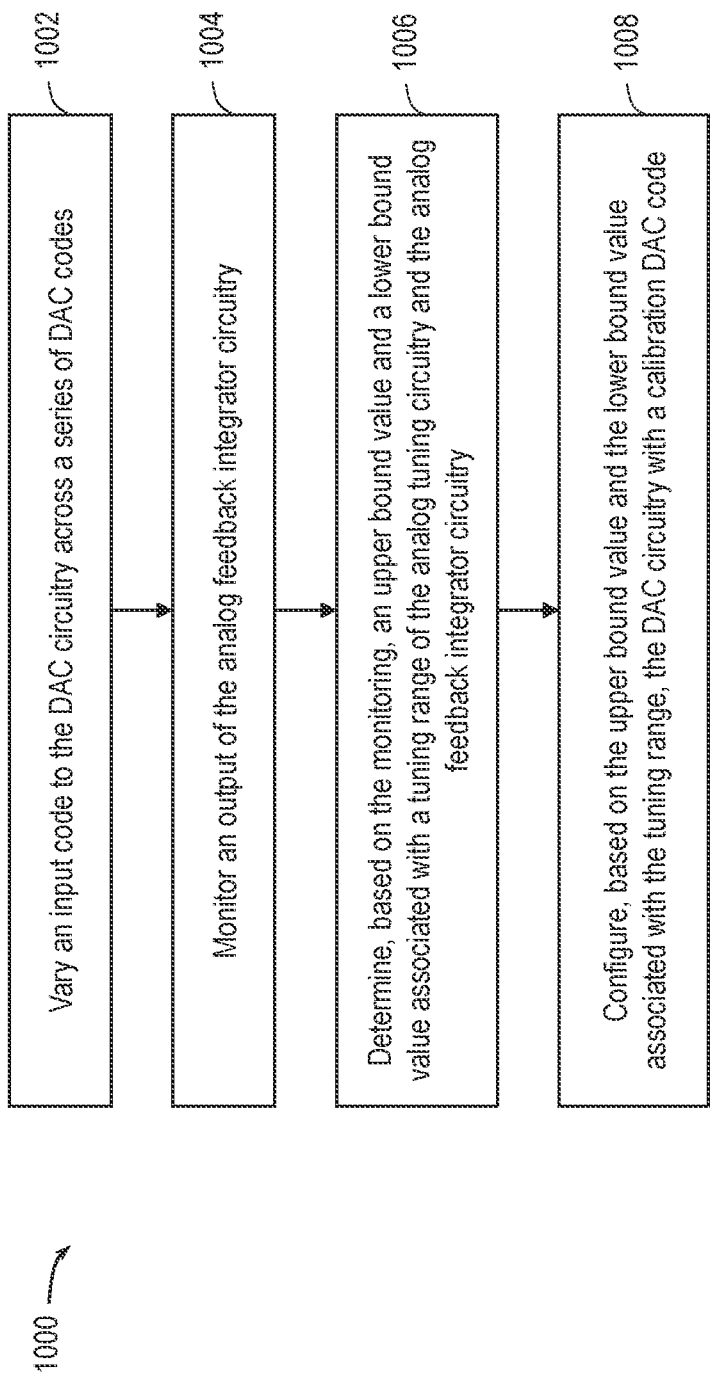
FIG. 10 is a flow diagram of an exemplary method for calibrating duty cycle correction circuitry, according to some embodiments of the disclosure.

FIGS. 8-10 are discussed in relation to FIGS. 2-7 to illustrate duty cycle correction circuitry calibration. FIG. 8 is a flow diagram of an exemplary method 800 for calibrating duty cycle correction circuitry, according to some embodiments of the disclosure. The method 800 may be performed by the controller 480, for example, based on firmware or programming code stored on memory and executed by the controller. More specifically, the method 800 may calibrate the common mode voltage of the analog feedback integrator circuitry 460. Although the operations of the method 800 may be illustrated with reference to particular embodiments of the duty cycle correction circuitry 230 and the controller 480 disclosed herein, the method 800 may be performed using any suitable hardware components and/or software components. Operations are illustrated once each and in a particular order in FIG. 8, but the operations may be performed in parallel, reordered, and/or repeated as desired.

The method 800 may be performed as part of operations at 712 and 714 of the method 700. For instance, the method 800 may be begin after configuring the analog feedback integrator circuitry 460 to operate in a unity gain mode. At a high level, the method 800 may determine a target threshold for comparators at the calibration ADC 470 based on a common mode voltage of the analog feedback integrator circuitry 460.

At 802, the controller 480 may set an ADC threshold code to a value of 1. For instance, the controller 480 may write the ADC threshold code to the ADC threshold register 604.

At 804, the controller 480 may determine whether both digital feedback codes DCMp 476 and DCMn 478 equal to 0. The digital feedback codes DCMp 476 and DCMn 478 are outputs of the analog feedback integrator circuitry 460 digitized by the calibration ADC 470 and sent to the controller 480. Because the inputs of the analog feedback integrator circuitry 460 is shorted and the capacitors C1 and C2 are bypassed, the output of the analog feedback integrator circuitry 460 may represent the common mode voltage of the analog feedback integrator circuitry 460. If both digital feedback codes both DCMp 476 and DCMn 478 equal to 0, the controller 480 may proceed to 806.

At 806, the controller 480 may adjust the ADC threshold code, for example, by taking the maximum between the highest ADC threshold code (e.g., 15) and a sum of the ADC threshold code and an offset e.g., 1, 2, 3, 4 or more). The highest ADC threshold code may be 15 for a 4-bit ADC threshold register 604. In general, the highest ADC threshold may depend on the number of bits available for the ADC threshold configuration. The offset added to the ADC threshold code may serve to set the ADC comparator threshold voltage to be above the common mode voltage of the analog feedback integrator circuitry 460.

At 808, the controller 480 may write the ADC threshold code determined from 806 to the ADC threshold register 604.

Returning to 804, if the digital feedback codes DCMp 476 and DCMn 478 are not zeros, the controller 480 may proceed to 812. At 812, the controller 480 may determine whether the ADC threshold code has reached the highest ADC threshold code 15. If the ADC threshold code has not reached the highest ADC threshold code 15, the controller 480 may proceed to 810 to increment the ADC threshold code by 1 and repeat the operations of 804. Otherwise, the controller 480 may proceed to 808 and perform the operations of 808.

While the method 800 calibrates the common mode voltage of the analog feedback integrator circuitry 460 by stepping up the ADC threshold codes from 1 to a full-scale ADC threshold code, similar mechanisms may be applied to step through the ADC threshold codes in a reverse order (e.g., from the full-scale ADC threshold code to 1).

FIG. 9 is a flow diagram of an exemplary method 900 for calibrating duty cycle correction circuitry, according to some embodiments of the disclosure. The method 900 may be performed by the controller 480, for example, based on firmware or programming code stored on memory and executed by the controller 480. Although the operations of the method 900 may be illustrated with reference to particular embodiments of the duty cycle correction circuitry 230 and the controller 480 disclosed herein, the method 900 may be performed using any suitable hardware components and/or software components. Operations are illustrated once each and in a particular order in FIG. 9, but the operations may be performed in parallel, reordered, and/or repeated as desired.

The method 900 may be performed as part of operations at 718 and 720 of the method 700. At a high level, the method 900 may disable the analog tuning circuitry 420 and determine an upper bound and a lower bound (e.g., extremes) of the analog tuning circuitry 420's tuning range. The method 900 may configure the coarse tuning circuitry 430 (e.g., the current DAC) such that the 2XFLO+' signal 232 and the 2XFLO-' signal 234) is at about a center of the tuning range. For instance, the method 900 may vary the input code to the DAC and at the same time, monitor the outputs of the analog feedback integrator circuitry 460 for an indication that the differential duty cycle of the 2XFLO+' signal 232 and the 2XFLO-' signal 224 transitions from below 50% to 50% (e.g., a first transition) and another indication that the differential duty cycle transitions from 50% to above 50% (e.g., a second transition). The method 900 may also handle corner cases where the incoming clock is skewed with a high duty cycle or a skewed with a low duty cycle.

At 902, the controller 480 may set a DAC code to 15 corresponding to a full-scale DAC code for a 4-bit DAC. For instance, the controller may write the DAC code to the DAC register 504. In general, the controller 480 may initialize the DAC to the full-scale DAC code, and thus the exact DAC code value may change depending on N for an N-bit DAC.

At 904, the controller 480 may determine whether both digital feedback codes DOVp 472 and DOVn 474 equal to 0. The digital feedback codes DOVp and DOVn are outputs (e.g., duty cycle error output voltage) of the analog feedback integrator circuitry 460 digitized by the calibration ADC 470 and sent to the controller 480. The digital feedback codes DOVp 472 and DOVn 474 may represent duty cycle information of the clock signals (e.g., the 2XFLO+' signal 232 and the 2XFLO-' signal 234) at the inputs of analog feedback integrator circuitry 460. If the digital codes DOVp 472 and DOVn 474 are both 0 (indicating the 2XFLO+' signal 222 and the 2XFLO-' signal 224 have the same 50% duty cycle, reaching the first transition), the controller 480 may proceed to 906. At 906, the controller 480 may assign the DAC code to an upper bound value (the upper bound of the tuning range).

Next, at 914, the controller 480 may determine whether the DAC code is 0 (reaching its minimum value or the DAC zero-scale code). If the DAC code is not 0, the controller 480 may proceed to 916. For instance, the controller 480 may move on to search for the DAC code that causes the second transition after locating the first transition. At 916, the controller 480 may decrement the DAC code by 1 (by writing to the DAC register 504).

At 918, the controller 480 may determine whether the digital feedback codes DOVp 472 and DOVn 474 are 0 and 1, respectively. If the digital feedback codes DOVp 472 and DOVn 474 are 0 and 1, respectively (indicating the differential duty cycle is too high, reaching the second transition), the controller 480 may proceed to 920. At 920, the controller 480 may set a lower bound value (the lower bound of the tuning range) to the DAC code.

Next, at 924, the controller 480 may calculate a calibration DAC code (e.g., the digital calibration code 482) based on the upper bound value and the lower bound value. For example, the calibration DAC code may be an average of the upper bound value and the lower bound value.

At 926, the controller 480 may write the calibration DAC code to the DAC register 504.

Returning to 904, if the controller 480 determines that the digital feedback codes DOVp 472 and DOVn 474 are not zeros, the controller 480 may proceed to 910. For instance, the full-scale DAC code may be too high, and thus the analog feedback integrator circuitry 460 may compensate and output a 1 for DOVp 472 and a 0 for DOVn 474. At 910, the controller 480 may determine whether the DAC code is 0. If the DAC code is not 0, the controller 480 may proceed to 908 to decrement the DAC code by 1 and return to 904 (e.g., to search for the first transition). If the DAC code is 0 (reaching its minimum value or the DAC zero-scale code), the controller 480 may proceed to 912. At 912, the controller 480 may set the upper bound value to 15 (the full-scale DAC code) and the lower bound value to 0 (the zero-scale DAC code) and proceed to 924. In some instances, the controller 480 may reach 912 when the incoming clock 2XFLO is skewed with a low duty cycle.

Returning to 914, if the controller 480 determines that the DAC code is 0, the controller 480 may proceed to 922. At 922, the controller 480 may set the lower bound value to 0 (the zero-scale DAC code) and proceed to 924. In some instances, the controller 480 may reach 922 when the incoming clock 2XFLO is skewed with a high duty cycle.

Returning to 918, if the controller 480 determines that the digital feedback codes DOVp 472 and DOVn 474 are not 0 and 1, respectively, the controller 480 may proceed to 914.

While the method 900 performs calibration or coarse tuning by stepping through the DAC codes from a maximum or full-scale DAC code to a zero DAC code, similar mechanisms may be applied to step through the DAC codes in a reverse order (e.g., from the zero DAC code to the full-scale DAC code). Further, the calibration ADC 470 used for providing digital feedbacks DOVp and DOVn representative of digital duty cycle error voltages at the output of the analog feedback integrator circuitry 460 can have any suitable resolution (e.g., a resolution of 2, 3, 4 or more bits). In general, the method 900 may step through the DAC codes and search for a DAC code that provides an ADC readout indicating an about zero duty cycle error voltage at the output of the analog feedback integrator circuitry 460.

FIG. 10 is a flow diagram of an exemplary method 1000 for calibrating duty cycle correction circuitry, according to some embodiments of the disclosure. The method 1000 may be performed by the controller 480, for example, based on firmware or programming code stored on memory and executed by the controller 480. The method 1000 may utilize similar mechanisms as discussed above with reference to FIGS. 4-9. Although the operations of the method 1000 may be illustrated with reference to particular embodiments of the duty cycle correction circuitry 230 and the controller 480 disclosed herein, the method 1000 may be performed using any suitable hardware components and/or software components. Operations are illustrated once each and in a particular order in FIG. 10, but the operations may be performed in parallel, reordered, and/or repeated as desired.

At 1002, the controller 480 may vary an input code to the DAC circuitry (e.g., the coarse tuning circuitry 430) across a series of DAC codes, for example, in a descending order by stepping down the series of DAC codes as discussed above with reference to FIG. 9.

At 1004, the controller 480 may monitor an output of the analog feedback integrator circuitry 460. The output of the analog feedback integrator circuitry 460 may be indicative of duty cycle information associated with a pair of clock signals (e.g., the 2XFLO+' signal 232 and the 2XFLO−' signal 234 at the inputs of the analog feedback integrator circuitry 460) and responsive to the varying of the input code to the DAC circuitry. The analog feedback integrator circuitry 460 may generate an output or feedback for each input code while the input code is being varied. To that end, the analog feedback integrator circuitry 460 may integrate differences between the pair of clock signals to provide the output (e.g., analog feedback signals OVp 462 and OVn 464) as discussed above. The analog feedback integrator circuitry 460's output may be digitized by the calibration ADC 470 to digital codes DOVp 472 and DOVn 474, and the controller 480 may read the digital codes DOVp 472 and DOVn 474.

At 1006, the controller 480 may determine, based on the monitoring, an upper bound value and a lower bound value associated with a tuning range of the analog tuning loop circuitry 408 (including the analog tuning circuitry 420 and the analog feedback integrator circuitry 460).

In some aspects, the determining may include searching for an optimal input DAC code that provides an ADC code (e.g., DOVp 472 and/or DOVn 474) indicative of a target duty cycle error voltage (e.g., an error voltage of about 0 V corresponding to about a duty cycle of about 50%). For instance, the determining may include comparing the ADC code to a target code value corresponding to the target duty cycle error voltage.

In some aspects, the determining may include assigning a first DAC code of the series of DAC codes to the upper bound value. The assigning may be based on a first output of the analog feedback integrator circuitry 460 responsive to the first DAC code indicates a duty cycle of the pair of clock signals satisfying a target duty cycle, for example, when a difference between the pair of clock signals (the differential inputs at the analog feedback integrator circuitry 460) has a 50% duty cycle or a zero DC offset. In some instances, this condition may correspond to DOVp 472 and DOVn 474 being 0 as discussed above.

In some aspects, the determining may include assigning, to the lower bound value, a second DAC code of the series of DAC codes. The assigning may be based on a second output of the analog feedback integrator circuitry 460 responsive to the second DAC code indicates the duty cycle of the pair of clock signals crosses (or exceeds) the target duty cycle, for example, when a difference between the pair of clock signals (the differential inputs at the analog feedback integrator circuitry 460) has a duty cycle greater than 50% or a DC offset greater than 0. In some instances, this condition may correspond to DOVp 472 being 0 and DOVn 474 being 1 as discussed above. In some aspects, the determining the upper bound value and the lower bound value may include, determining based on the monitoring, no output from the analog feedback integrator circuitry after the first output indicates a duty cycle of the pair of clock signals crosses the target duty cycle (e.g., when the incoming clock 2XFLO signal to the duty cycle correction circuitry 230 is skewed with a high duty cycle). In response, the controller 480 assigns a zero-scale DAC code to the lower bound value.

In some aspects, the determining the upper bound value and the lower bound value may include determining, based on the monitoring, no output from the analog feedback integrator circuitry 460 indicates a duty cycle of the pair of clock signals satisfies a target duty cycle (e.g., when the incoming clock 2XFLO signal to the duty cycle correction circuitry 230 is skewed with a low duty cycle). In response, the controller 480 assigns a full-scale DAC code to the upper bound value and a zero-scale DAC code to the lower bound value.

At 1008, the controller 480 may configure, based on the upper bound value and the lower bound value associated with the tuning range, the DAC circuitry with a calibration DAC code. For instance, the controller 480 may calculate the calibration DAC code based on the upper bound value and the lower bound value associated with the tuning range, for example, by computing an average value of the upper bound value and the lower bound value.

In some aspects, the controller 480 may calculate the calibration DAC code further based on a common mode voltage of the analog feedback integrator circuitry 460. In some aspects, the controller 480 may further configure a comparator threshold for ADC circuitry (e.g., the calibration ADC 470) based on the common voltage of the analog feedback integrator circuitry 460. In some aspects, the configuring the comparator threshold of the ADC circuitry is further based on an offset. In some aspects, the controller 480 may further close the switches S1, S2, and S3 of the analog feedback integrator circuitry 460 to short integration capacitors (e.g., the capacitors C1 and C2) and inputs of the analog feedback integrator circuitry 460, and measure the common mode voltage of the analog feedback integrator circuitry 460 while the switches S1, S2, and S3 are closed.

EXAMPLES

Example 1 includes a frequency converter arrangement for converting a first signal centered at a first frequency to a second signal centered at a second frequency different from the first frequency, the frequency converter arrangement including local oscillator (LO) circuitry including duty cycle correction circuitry to adjust a duty cycle of a pair of input clock signals, where the duty cycle correction circuitry includes coarse tuning circuitry responsive to a digital calibration code; and analog tuning loop circuitry; and quadrature divider circuitry coupled to an output of the duty cycle correction circuitry, where the quadrature divider circuitry generates an in-phase LO signal and a quadrature-phase LO signal from a pair of output clock signals at outputs of the duty cycle correction circuitry; and in-phase, quadrature-phase (IQ) mixer circuitry coupled to the LO circuitry.

In Example 2, the frequency converter arrangement of Example 1 can optionally include the coarse tuning circuitry adjusts the duty cycle of the pair of input clock signals to within a tuning range of the analog tuning loop circuitry.

In Example 3, the frequency converter arrangement of any of Examples 1-2 can optionally include the analog tuning loop circuitry adjusts the duty cycle of the pair of input clock signals responsive to a duty cycle change in the pair of input clock signals.

In Example 4, the frequency converter arrangement of any of Examples 1-3 can optionally include the analog tuning loop circuitry includes analog tunning circuitry and analog feedback integrator circuitry.

In Example 5, the frequency converter arrangement of any of Examples 1-4 can optionally include the duty cycle correction circuitry further includes a forward clock path including the analog tuning circuitry and the coarse tuning circuitry; and a feedback clock path coupled to the forward clock path, the feedback clock path including the analog feedback integrator circuitry.

In Example 6, the frequency converter arrangement of any of Examples 1-5 can optionally include the coarse tuning circuitry includes a digital-to-analog converted (DAC) circuitry; and the frequency converter arrangement further includes a controller to vary, during a calibration phase, an input code to the DAC circuitry across a series of DAC codes; monitor, during the calibration phase, a state of the analog feedback integrator circuitry responsive to the varying; and calculate the digital calibration code responsive to the monitoring.

In Example 7, the frequency converter arrangement of any of Examples 1-6 can optionally include the forward clock path includes a pair of differential clock paths, each coupled to one clock signal of the pair of input clock signals.

In Example 8, the frequency converter arrangement of any of Examples 1-7 can optionally include the analog feedback integrator circuitry generates an analog feedback signal including duty cycle information of the pair of output clock signals; and the analog tuning circuitry includes a current steering element coupled to the pair of differential clock paths, where the current steering element steers, responsive to the analog feedback signal, at least one of a first current to one clock path of the pair of differential clock paths or a second current to the other clock path of the pair of differential clock paths.

In Example 9, the frequency converter arrangement of any of Examples 1-8 can optionally include the coarse tuning circuitry includes a current steering digital-to-analog converter (DAC) coupled to the pair of differential clock paths, and where the current steering DAC steers, responsive to the digital calibration code, a current to one clock path of the pair of differential clock paths or to the other clock path of the pair of differential clock paths.

In Example 10, the frequency converter arrangement of any of Examples 1-3 can optionally include the duty cycle correction circuitry further includes level adjustment circuitry to limit voltage levels of the pair of output clock signals based on a threshold; and scale the voltage levels of the pair of output clock signals.

In Example 11, the frequency converter arrangement of any of Examples 1-10 can optionally include the duty cycle correction circuitry further includes first circuitry to convert the pair of input clock signals from complementary metal-oxide-semiconductor (CMOS) voltage levels to common mode logic (CML) voltage level; and second circuitry to convert the pair of output clock signals from the CML voltage levels to the CMOS levels.

In Example 12, the frequency converter arrangement of any of Examples 1-11 can optionally include the LO circuitry further includes a voltage-controlled oscillator (VCO) having a frequency two times an LO frequency. In some instances, the IQ mixer circuitry mixes the first signal with the in-phase LO signal and the quadrature-phase LO signal to generate an I component and a Q component of the second signal, for example, when the frequency converter arrangement is for a receiver. In other instances, the IQ mixer circuitry mixes an I component of the first signal with the in-phase LO signal and a Q component of the first signal with the quadrature-phase LO signal to generate the second signal, for example, when the frequency converter arrange is for a transmitter.

Example 13 includes a method of operating a duty cycle correction circuitry having analog tuning circuitry, analog feedback integrator circuitry, and digital-to-analog converter (DAC) circuitry, the method including varying an input code to the DAC circuitry across a series of DAC codes; monitoring an output of the analog feedback integrator circuitry, where the output of the analog feedback integrator circuitry is indicative of duty cycle information associated with a pair of clock signals and responsive to the varying; determining, based on the monitoring, an upper bound value and a lower bound value associated with a tuning range of the analog tuning circuitry and the analog feedback integrator circuitry; and configuring, based on the upper bound value and the lower bound value associated with the tuning range, the DAC circuitry with a calibration DAC code.

In Example 14, the method of Example 13 can optionally include the monitoring the output of the analog feedback integrator circuitry includes reading, in response to each DAC code of at least some of the DAC codes in the series, an analog-to-digital (ADC) code indicative of a duty cycle error voltage at the output of the analog feedback integrator circuitry; and the determining the upper bound value and the lower bound value includes searching for a DAC code that provides an ADC code indicative of a target duty cycle error voltage.

In Example 15, the method of any of the Examples 13-14 can optionally include the determining the upper bound value and the lower bound value includes determining, based on the monitoring, no output from the analog feedback integrator circuitry indicates a duty cycle of the pair of clock signals satisfies a target duty cycle; and assigning at least one of a full-scale DAC code to the upper bound value or a zero-scale DAC code to the lower bound value, where the assigning is based on determining no output from the analog feedback integrator circuitry indicates the duty cycle of the pair of clock signals satisfies the target duty cycle.

In Example 16, the method of any of the Examples 13-15 can optionally include the determining the upper bound value and the lower bound value includes assigning, to the upper bound value, a first DAC code of the series of DAC codes, where the assigning is based on a first output of the analog feedback integrator circuitry responsive to the first DAC code indicates a duty cycle of the pair of clock signals satisfying a target duty cycle.

In Example 17, the method of any of the Examples 13-16 can optionally include the determining the upper bound value and the lower bound value includes assigning, to the lower bound value, a second DAC code of the series of DAC codes, where the assigning is based on a second output of the analog feedback integrator circuitry responsive to the second DAC code indicates the duty cycle of the pair of clock signals crosses the target duty cycle.

In Example 18, the method of any of the Examples 13-17 can optionally include the determining the upper bound value and the lower bound value includes determining, based on the monitoring, no output from the analog feedback integrator circuitry after the first output indicates a duty cycle of the pair of clock signals crosses the target duty cycle; and assigning a zero-scale DAC code to the lower bound value based on determining no output from the analog feedback integrator circuitry after the first output indicates a duty cycle of the pair of clock signals passes the target duty cycle.

In Example 19, the method of any of the Examples 13-18 can optionally include calculating the calibration DAC code based on the upper bound value and the lower bound value associated with the tuning range.

In Example 20, the method of any of the Examples 13-19 can optionally include the calculating the calibration DAC code is further based on an average value of the upper bound value and the lower bound value associated with the tuning range.

In Example 21, the method of any of the Examples 13-20 can optionally include the calculating the calibration DAC code is further based on a common mode voltage of the analog feedback integrator circuitry.

In Example 22, the method of any of the Examples 13-21 can optionally include configuring a comparator threshold of ADC circuitry based on the common mode voltage of the analog feedback integrator circuitry.

In Example 23, the method of any of the Examples 13-22 can optionally include the configuring the comparator threshold of the ADC circuitry is further based on an offset.

In Example 24, the method of any of the Examples 13-23 can optionally include closing one or more switches of the analog feedback integrator circuitry to short integration capacitors and inputs of the analog feedback integrator circuitry; and measuring the common mode voltage of the analog feedback integrator circuitry while the one or more switches are closed.

Example 25 includes an apparatus including duty cycle correction circuitry responsive to a pair of clock signals, the duty cycle correction circuitry including coarse tuning circuitry including a current steering digital-to-analog converter (DAC); and analog tuning loop circuitry including a current steering element and feedback integrator circuitry; and a controller configured to vary an input code to the current steering DAC across a series of DAC codes; monitoring an output of the feedback integrator circuitry, where the output of the feedback integrator circuitry is indicative of duty cycle information associated with the pair of clock signal and responsive to the varying; determine, based on the monitoring, an upper bound value and a lower bound value associated with a tuning range of the analog tuning loop circuitry; and configure, based on the upper bound value and the lower bound value associated with the tuning range, the DAC with a calibration DAC code.

In Example 26, the apparatus of Example 25 can optionally include the controller determines the upper bound value further by identifying, based on the monitoring, a first DAC code of the series of DAC codes that causes the output of the feedback integrator circuitry to transition from a first state to a second state, where the second state indicates a duty cycle of the pair of clock signals satisfies a target duty cycle; and assigning the first DAC code to the upper bound value.

In Example 27, the apparatus of any of Examples 25-26 can optionally include the controller determines the lower bound value further by identifying, based on the monitoring, a first DAC code of the series of DAC codes that causes the output of the feedback integrator circuitry to transition from a first state to a second state, where the first state indicates a duty cycle of the pair of clock signals satisfies a target duty cycle; and assigning the first DAC code to the lower bound value.

Variations and Implementations

While embodiments of the present disclosure were described above with references to exemplary implementations as shown in FIGS. 1-10, a person skilled in the art will realize that the various teachings described above are applicable to a large variety of other implementations.

In certain contexts, the features discussed herein can be applicable to automotive systems, safety-critical industrial applications, medical systems, scientific instrumentation, wireless and wired communications, radio, radar, industrial process control, audio and video equipment, current sensing, instrumentation (which can be highly precise), and other digital-processing-based systems.

In the discussions of the embodiments above, components of a system, such as filters, converters, mixers, LO circuitries, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to complex downconverters, in various communication systems.

Parts of various systems for implementing complex downconverters as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components of the arrangements shown in FIGS. 1-6) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present figures may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Also, as used herein, including in the claims, "or" as used in a list of items (for example, a list of items prefaced by a phrase such as "at least one of" or "one or more of") indicates an inclusive list such that, for example, a list of [at least one of A, B, or C] means A or B or C or AB or AC or BC or ABC (i.e., A and B and C).

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Also, as used herein, the terms "substantially," "approximately," "about," etc., may be used to generally refer to being within +/−20% of a target value, e.g., within +/−10% of a target value, based on the context of a particular value as described herein or as known in the art.

Numerous other changes, substitutions, variations, alterations, and modifications may be ascertained to one skilled in the art and it is intended that the present disclosure encompass all such changes, substitutions, variations, alterations, and modifications as falling within the scope of the examples and appended claims. Note that all optional features of the apparatus described above may also be implemented with respect to the method or process described herein and specifics in the examples may be used anywhere in one or more embodiments.

The invention claimed is:

1. A frequency converter arrangement for converting a first signal centered at a first frequency to a second signal centered at a second frequency different from the first frequency, the frequency converter arrangement comprising:
    local oscillator (LO) circuitry comprising:
        duty cycle correction circuitry to adjust a duty cycle of a pair of input clock signals to provide a pair of output clock signals, wherein the duty cycle correction circuitry comprises:
            (1) coarse tuning circuitry configured to correct the duty cycle of the pair of input clock signals, the coarse tuning circuitry responsive to a digital calibration code; and
            (2) an analog feedback circuit comprising an analog input coupled to receive an analog signal generated from the pair of output clock signals and an analog output comprising a pair of differential clock paths provided to the coarse tuning circuitry, the analog feedback circuit comprising a current steering element coupled to the pair of differential clock paths, the current steering element configured to steer, responsive to an analog feedback signal, at least one of a first current to one clock path of the pair of differential clock paths or a second current to another clock path of the pair of differential clock paths; and
        quadrature divider circuitry coupled to an output of the duty cycle correction circuitry, wherein the quadrature divider circuitry generates an in-phase LO signal and a quadrature-phase LO signal from the pair of output clock signals at outputs of the duty cycle correction circuitry; and
    in-phase, quadrature-phase (IQ) mixer circuitry coupled to the LO circuitry.

2. The frequency converter arrangement of claim 1, wherein the coarse tuning circuitry adjusts the duty cycle of the pair of input clock signals to within a tuning range of the analog feedback circuit.

3. The frequency converter arrangement of claim 1, wherein the analog feedback circuit adjusts the duty cycle of the pair of input clock signals using the analog output responsive to a duty cycle change in the pair of input clock signals represented by the analog signal generated from the output clock signals.

4. The frequency converter arrangement of claim 1, wherein the analog feedback circuit comprises an analog integrator to provide the analog signal generated from the output clock signals.

5. The frequency converter arrangement of claim 4, wherein the duty cycle correction circuitry further comprises:
    a forward clock path comprising the analog output and the coarse tuning circuitry; and
    a feedback clock path coupled to the forward clock path, the feedback clock path comprising the analog integrator.

6. The frequency converter arrangement of claim 5, wherein:
    the coarse tuning circuitry comprises a digital-to-analog converted (DAC) circuitry; and
    the frequency converter arrangement further comprises a controller to:
    vary, during a calibration phase, an input code to the DAC circuitry across a series of DAC codes;
    monitor, during the calibration phase, a state of the analog feedback integrator circuitry responsive to the varying; and
    calculate the digital calibration code responsive to the monitoring.

7. The frequency converter arrangement of claim 5, wherein:
    the forward clock path comprises the pair of differential clock paths, each coupled to one clock signal of the pair of input clock signals.

8. The frequency converter arrangement of claim 7, wherein:
    the analog integrator is configured to generate the analog feedback signal including duty cycle information of the pair of output clock signals.

9. The frequency converter arrangement of claim 7, wherein the coarse tuning circuitry comprises a current steering digital-to-analog converter (DAC) coupled to the pair of differential clock paths, and wherein the current steering DAC steers, responsive to the digital calibration code, a current to one clock path of the pair of differential clock paths or to another clock path of the pair of differential clock paths.

* * * * *